United States Patent
Lee et al.

(10) Patent No.: US 10,043,818 B2
(45) Date of Patent: Aug. 7, 2018

(54) SEMICONDUCTOR DEVICES INCLUDING STACKED ELECTRODES

(71) Applicants: Hyun-Min Lee, Seoul (KR); Woo-Sung Yang, Gwangmyeong-si (KR); Kwan-Yong Kim, Uijeongbu-si (KR)

(72) Inventors: Hyun-Min Lee, Seoul (KR); Woo-Sung Yang, Gwangmyeong-si (KR); Kwan-Yong Kim, Uijeongbu-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/381,823

(22) Filed: Dec. 16, 2016

(65) Prior Publication Data
US 2017/0250194 A1    Aug. 31, 2017

(30) Foreign Application Priority Data
Feb. 26, 2016  (KR) .................. 10-2016-0023243

(51) Int. Cl.
| H01L 29/788 | (2006.01) |
| H01L 27/11582 | (2017.01) |
| H01L 27/1157 | (2017.01) |
| H01L 27/11573 | (2017.01) |
| H01L 27/11575 | (2017.01) |

(52) U.S. Cl.
CPC .... *H01L 27/11582* (2013.01); *H01L 27/1157* (2013.01); *H01L 27/11573* (2013.01); *H01L 27/11575* (2013.01)

(58) Field of Classification Search
None
See application file for complete search history.

(56) References Cited

U.S. PATENT DOCUMENTS

| 8,530,350 B2 | 9/2013 | Freeman et al. |
| 8,564,050 B2 | 10/2013 | Park et al. |
| 8,592,890 B2 | 11/2013 | Watanabe et al. |
| 8,822,322 B2 | 9/2014 | Lee et al. |
| 9,041,093 B2 | 5/2015 | Tanaka et al. |
| 2012/0052674 A1* | 3/2012 | Lee ................. H01L 27/11578 438/591 |
| 2013/0009274 A1 | 1/2013 | Lee et al. |
| 2014/0070295 A1 | 3/2014 | Fukuda et al. |
| 2014/0197481 A1 | 7/2014 | Hwang et al. |
| 2014/0197546 A1 | 7/2014 | Hwang et al. |
| 2014/0203442 A1* | 7/2014 | Yun ...................... G11C 5/063 257/773 |
| 2015/0228623 A1 | 8/2015 | Oh et al. |
| 2016/0293626 A1 | 10/2016 | Kim et al. |

\* cited by examiner

*Primary Examiner* — Sitaramarao S Yechuri
(74) *Attorney, Agent, or Firm* — Myers Bigel, P.A.

(57) ABSTRACT

Semiconductor devices are provided. A semiconductor device includes first and second stacks of electrodes. Moreover, the semiconductor device includes first and second connection lines that connect the first and second stacks of electrodes. In some embodiments, the first connection lines have a first length and the second connection lines have a second length that is longer than the first length of the first connection lines. In some embodiments, the first connection lines connect inner portions of the first stack of electrodes to inner portions of the second stack of electrodes. In some embodiments, the second connection lines connect outer portions of the first stack of electrodes to outer portions of the second stack of electrodes.

21 Claims, 27 Drawing Sheets

SEMICONDUCTOR DEVICES INCLUDING STACKED ELECTRODES

CROSS-REFERENCE TO RELATED APPLICATION

This U.S. non-provisional patent application claims priority under 35 U.S.C. § 119 to Korean Patent Application No. 10-2016-0023243, filed on Feb. 26, 2016, in the Korean Intellectual Property Office, the entire contents of which are hereby incorporated by reference herein.

BACKGROUND

The present disclosure relates to semiconductor devices. Higher integration of semiconductor devices may be used to address consumer demand for superior performance and inexpensive prices. In the case of semiconductor memory devices, because their integration may be an important factor in determining product prices, increased integration may be especially beneficial. In the case of typical two-dimensional or planar semiconductor memory devices, because their integration is mainly determined by the area occupied by a unit memory cell, integration may be greatly influenced by the level of a fine pattern forming technology. However, the extremely expensive process equipment used to increase pattern fineness may set a practical limitation on increasing integration for two-dimensional or planar semiconductor memory devices.

To overcome such a limitation, three-dimensional memory devices (that is, including three-dimensionally arranged memory cells) have been proposed. In the case of a three-dimensional memory device, it may be beneficial to three-dimensionally arrange not only memory cells but also signal or interconnection lines (e.g., word lines or bit lines) providing access to the memory cells.

SUMMARY

A semiconductor device, according to some embodiments of present inventive concepts, may include a substrate including a cell array region and a connection region. The semiconductor device may include first and second electrode structures that extend in a first direction on the substrate and are spaced apart from each other in a second direction that intersects the first direction. Each of the first and second electrode structures may include first and second electrodes vertically and alternatingly stacked on the substrate and including a stair-step structure on the connection region. The semiconductor device may include respective string selection electrodes on the first and second electrode structures. Each of the string selection electrodes may include first and second string selection electrodes that are spaced apart from each other in the second direction by an insulating separation layer. The semiconductor device may include first connection lines that connect coplanar ones of the first electrodes of the first and second electrode structures. The semiconductor device may include second connection lines that connect coplanar ones of the second electrodes of the first and second electrode structures. Each of the first connection lines may include a line-shaped structure extending in the second direction. Moreover, each of the second connection lines may include a shape different from the line-shaped structure when viewed in a plan view.

A semiconductor device, according to some embodiments, may include a substrate including a cell array region and a connection region. The semiconductor device may include first and second electrode structures that extend in a first direction on the substrate and are spaced apart from each other in a second direction that intersects the first direction. Each of the first and second electrode structures may include first and second electrodes vertically and alternatingly stacked on the substrate and including a stair-step structure on the connection region. Each of the first electrodes may include a first pad region at an end portion thereof, and each of the second electrodes may include a second pad region at an end portion thereof. Moreover, when viewed in a plan view, the first pad regions may be arranged in the first direction and each of the second pad regions may be adjacent a corresponding one of the first pad regions in the second direction. The semiconductor device may include first contacts coupled to the first pad regions, respectively. The semiconductor device may include second contacts coupled to the second pad regions, respectively. The semiconductor device may include first connection lines, each of which connects ones of the first contacts that are adjacent each other in the second direction. The semiconductor device may include second connection lines, each of which connects ones of the second contact plugs that are adjacent each other in the second direction. The semiconductor device may include first metal lines, each of which is connected to ones of the first connection lines in a first group and ones of the second connection lines in the first group. The semiconductor device may include second metal lines at a higher level than the first metal lines. Each of the second metal lines may be connected to ones of the first connection lines in a second group and ones of the second connection lines in the second group.

A semiconductor device, according to some embodiments, may include first and second stacks of electrodes. The semiconductor device may include a plurality of first connection lines that connect inner portions of the first stack of electrodes to inner portions of the second stack of electrodes. The plurality of first connection lines may have a first length. Moreover, the semiconductor device may include a plurality of second connection lines that have a second length longer than the first length. The plurality of second connection lines connect outer portions of the first stack of electrodes to outer portions of the second stack of electrodes.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
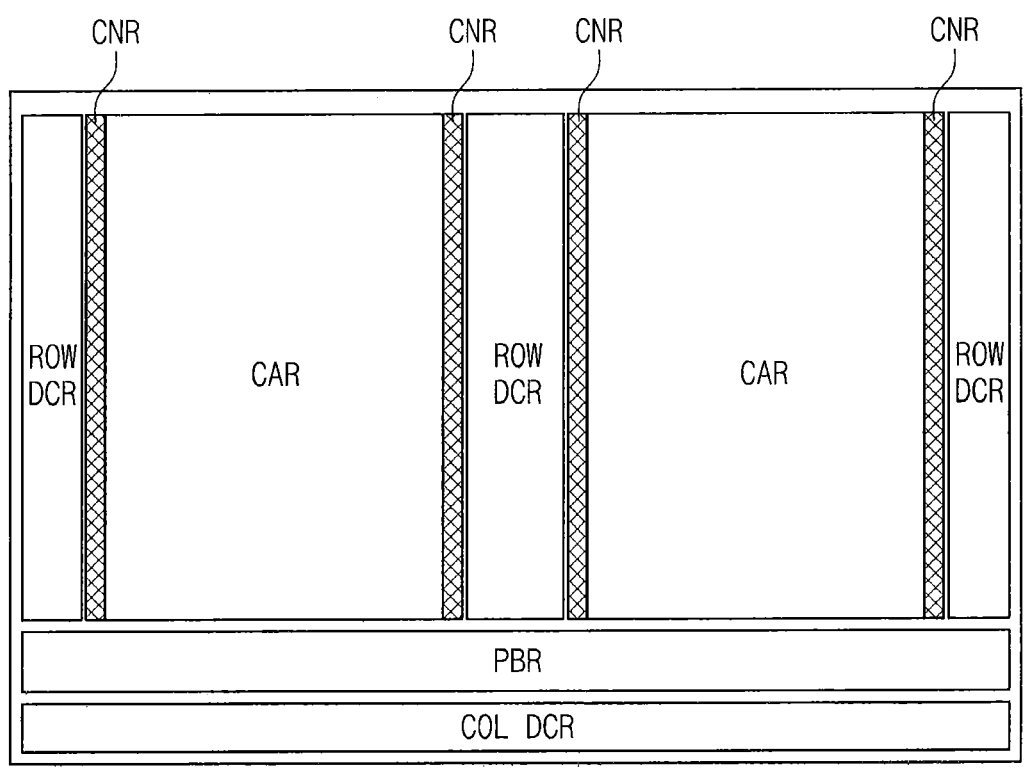
FIG. 1 is a schematic diagram illustrating a chip layout of a semiconductor device according to some embodiments of present inventive concepts.

FIG. 1 is a schematic diagram illustrating a chip layout of a semiconductor device according to some embodiments of present inventive concepts.

Referring to FIG. 1, a semiconductor device may include a cell array region CAR and a peripheral circuit region. The peripheral circuit region may include row decoder regions ROW DCR, a page buffer region PBR, a column decoder region COL DCR, and a control circuit region. In some embodiments, a connection region CNR may be provided between the cell array region CAR and each of the row decoder regions ROW DCR.

A memory cell array may be provided in the cell array region CAR. In some embodiments, the memory cell array may include a plurality of memory cells, which are three-dimensionally arranged in the memory cell array, and a plurality of word and bit lines, which are electrically connected to the memory cells.

In each of the row decoder regions ROW DCR, a row decoder may be provided to select at least one of the word lines that are provided in the memory cell array, and in the connection region CNR, an interconnection structure may be provided to electrically connect the memory cell array to the row decoder. The row decoder may be configured to select at least one of the word lines, based on address information. The row decoder may be configured to apply different word line voltages to selected and unselected ones, respectively, of the word lines, in response to control signals from a control circuit.

In the page buffer region PBR, a page buffer may be provided to read out data stored in the memory cells. Depending on an operation mode, the page buffer may be configured to temporarily store data in the memory cells or to read out data stored in the memory cells. For example, the page buffer may function as a write driver in a program operation mode or as a sense amplifier in a read operation mode.

A column decoder may be provided in the column decoder region COL DCR. The column decoder may be connected to the bit lines of the memory cell array to provide data-transmission paths between the page buffer and an external device (e.g., a memory controller).

Figure 2:
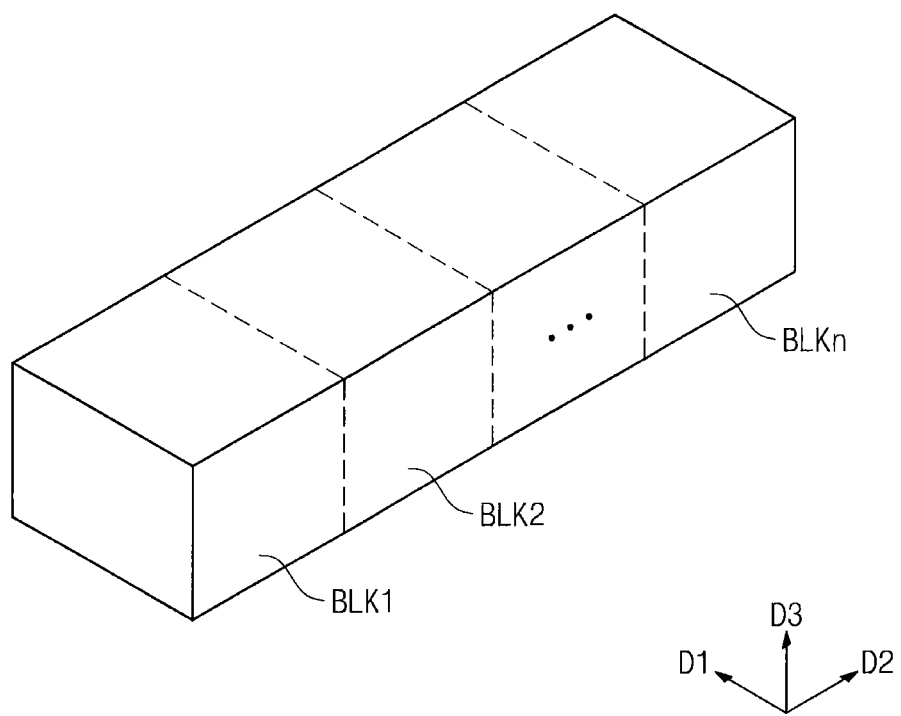
FIG. 2 is a schematic block diagram illustrating a cell array of a semiconductor device according to some embodiments of present inventive concepts.

FIG. 2 is a schematic block diagram illustrating a cell array of a semiconductor device according to some embodiments of present inventive concepts.

Referring to FIG. 2, a memory cell array may include a plurality of memory blocks BLK1, BLK2, . . . , BLKn. Each of the memory blocks BLK1, BLK2, . . . , BLKn may include an electrode structure including a plurality of electrodes stacked in a third direction D3 on a plane defined by first and second directions D1 and D2. The electrode structure may be coupled to a plurality of vertical pillars or semiconductor pillars to constitute three-dimensionally arranged memory cells. In addition, each of the memory blocks BLK1, BLK2, . . . , BLKn may include a plurality of bit lines that are electrically connected to the memory cells.

Figure 3:
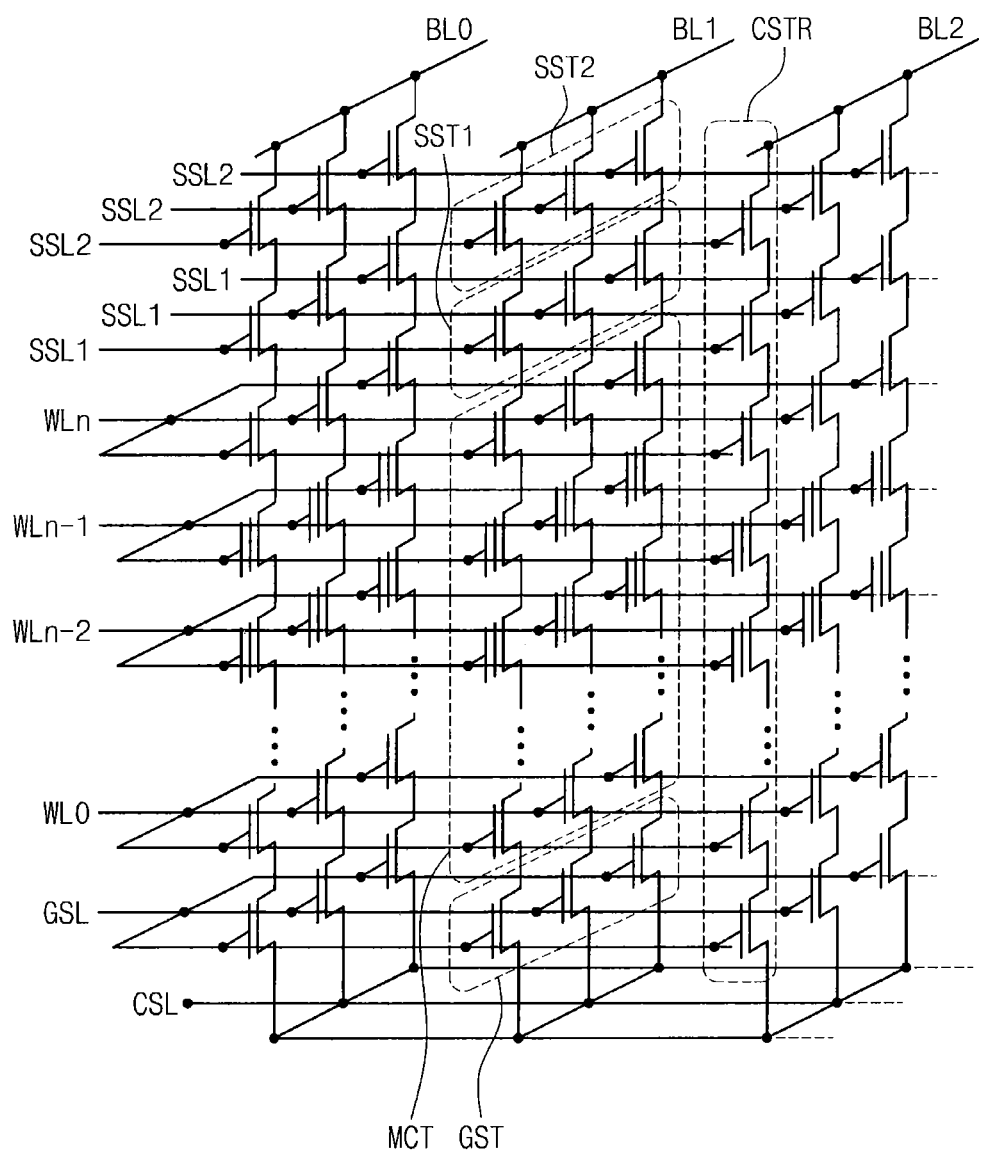
FIG. 3 is a schematic circuit diagram of a semiconductor device according to some embodiments of present inventive concepts.

FIG. 3 is a schematic circuit diagram of a semiconductor device according to some embodiments of present inventive concepts.

Referring to FIG. 3, a semiconductor device according to some embodiments of present inventive concepts may include a common source line CSL, a plurality of bit lines BL0-BL2, and a plurality of cell strings CSTR disposed between the common source line CSL and the bit lines BL0-BL2.

The bit lines BL0-BL2 may be two-dimensionally arranged, and a plurality of cell strings CSTR may be connected in parallel to each of the bit lines BL0-BL2. The plurality of cell strings CSTR may be connected in common to the common source line CSL. In other words, a plurality of cell strings CSTR may be provided between the bit lines BL0-BL2 and the common source line CSL. In some embodiments, a plurality of common source lines CSL may be two-dimensionally arranged. The common source lines CSL may be applied with the same voltage or may be independently controlled.

In some embodiments, each of the cell strings CSTR may include a plurality of string selection transistors SST1 and SST2, which are connected in series to each other, memory cells MCT, which are connected in series to each other, and a ground selection transistor GST. Each of the memory cells MCT may include a data storage element.

As an example, each of the cell strings CSTR may include first and second string selection transistors SST1 and SST2, the second string selection transistor SST2 may be coupled to the bit lines BL0-BL2, and the ground selection transistor GST may be coupled to the common source line CSL. The memory cells MCT may be provided between the first string selection transistor SST1 and the ground selection transistor GST and may be connected in series to each other.

In some embodiments, in each of the cell strings CSTR, the ground selection transistor GST may include a plurality of metal-oxide-semiconductor (MOS) transistors, which are connected in series to each other, similar to the string selection transistors SST1 and SST2. In some embodiments, each of the cell strings CSTR may include one string selection transistor. In some embodiments, each of the cell strings CSTR may further include a dummy cell that is connected between the first string selection transistor SST1 and the memory cell MCT.

The first string selection transistor SST1 may be controlled by a first string selection line SSL1, and the second string selection transistor SST2 may be controlled by a second string selection line SSL2. The memory cells MCT may be controlled by a plurality of word lines WL0-WLn. The ground selection transistor GST may be controlled by a ground selection line GSL. The common source line CSL may be connected in common to sources of the ground selection transistors GST.

Since each cell string CSTR includes the plurality of memory cells MCT that are positioned at different heights from the common source line CSL, the word lines WL0-WLn between the common source line CSL and the bit lines BL0-BL2 may be provided to have a multi-layered structure.

In addition, gate electrodes of the memory cells MCT, which are disposed at the substantially same height from the common source line CSL, may be connected in common to one of the word lines WL0-WLn, thereby being in an equipotential state. Alternatively, although the gate electrodes of the memory cells MCT are disposed at the substantially same height from the common source line CSL, some of them (e.g., disposed in a different row or column) may be independently controlled.

Figure 4:
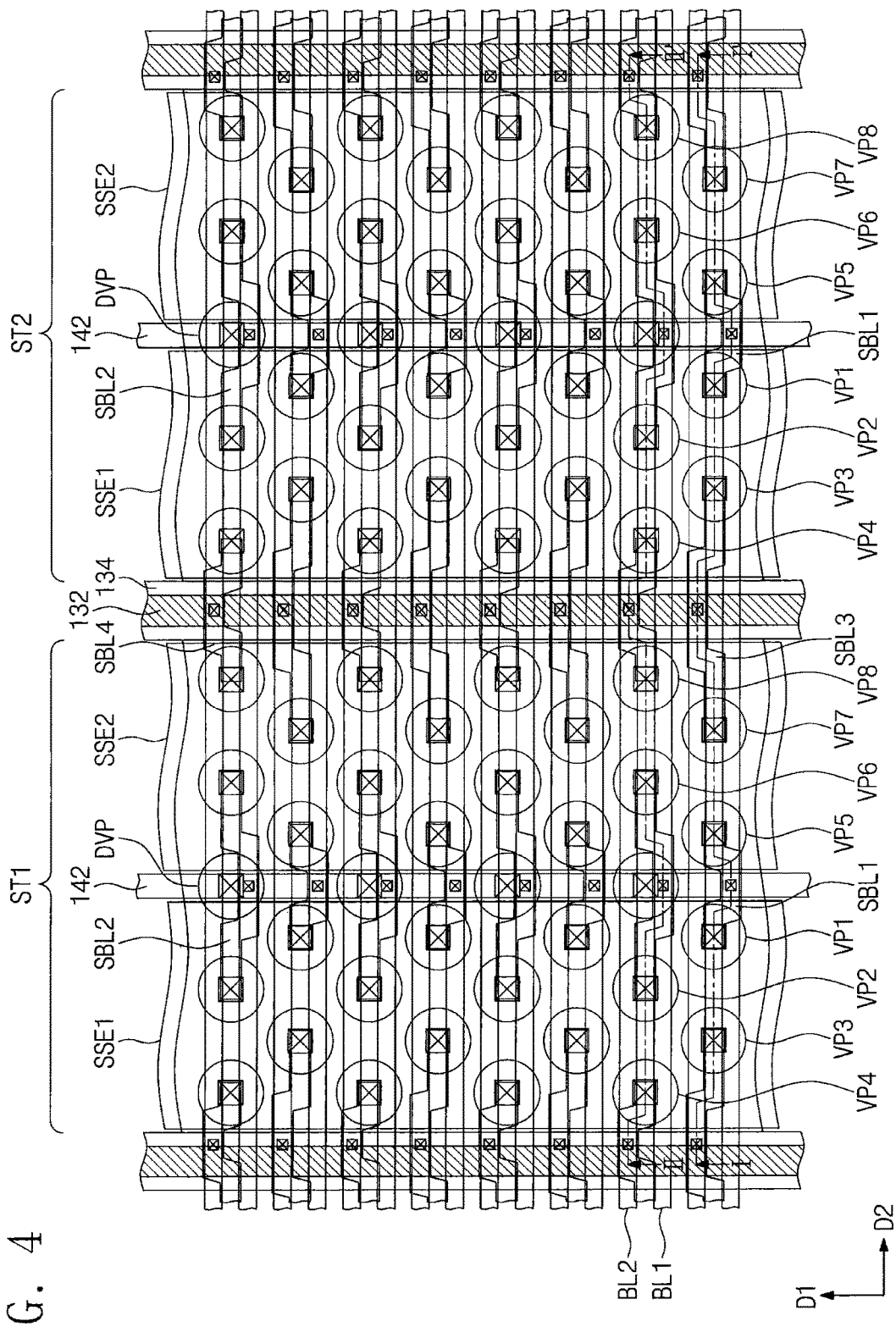
FIGS. 4 and 5 are plan views of a semiconductor device according to some embodiments of present inventive concepts.
Figure 5:
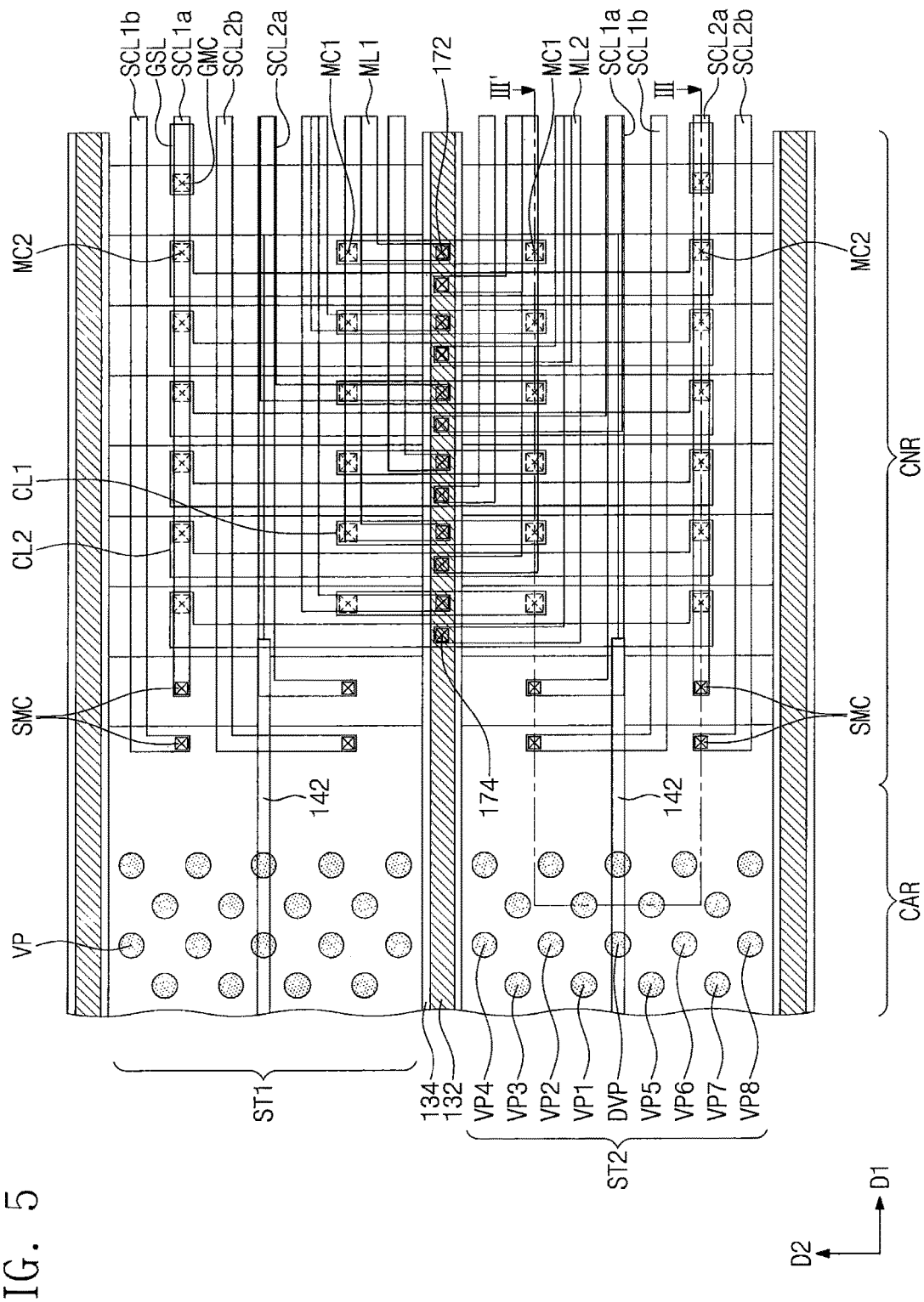

FIGS. 4 and 5 are plan views of a semiconductor device according to some embodiments of present inventive concepts. In detail, FIG. 4 illustrates the cell array region of the semiconductor device according to some embodiments of present inventive concepts, and FIG. 5 illustrates the cell array region and the connection region.

Figure 6:
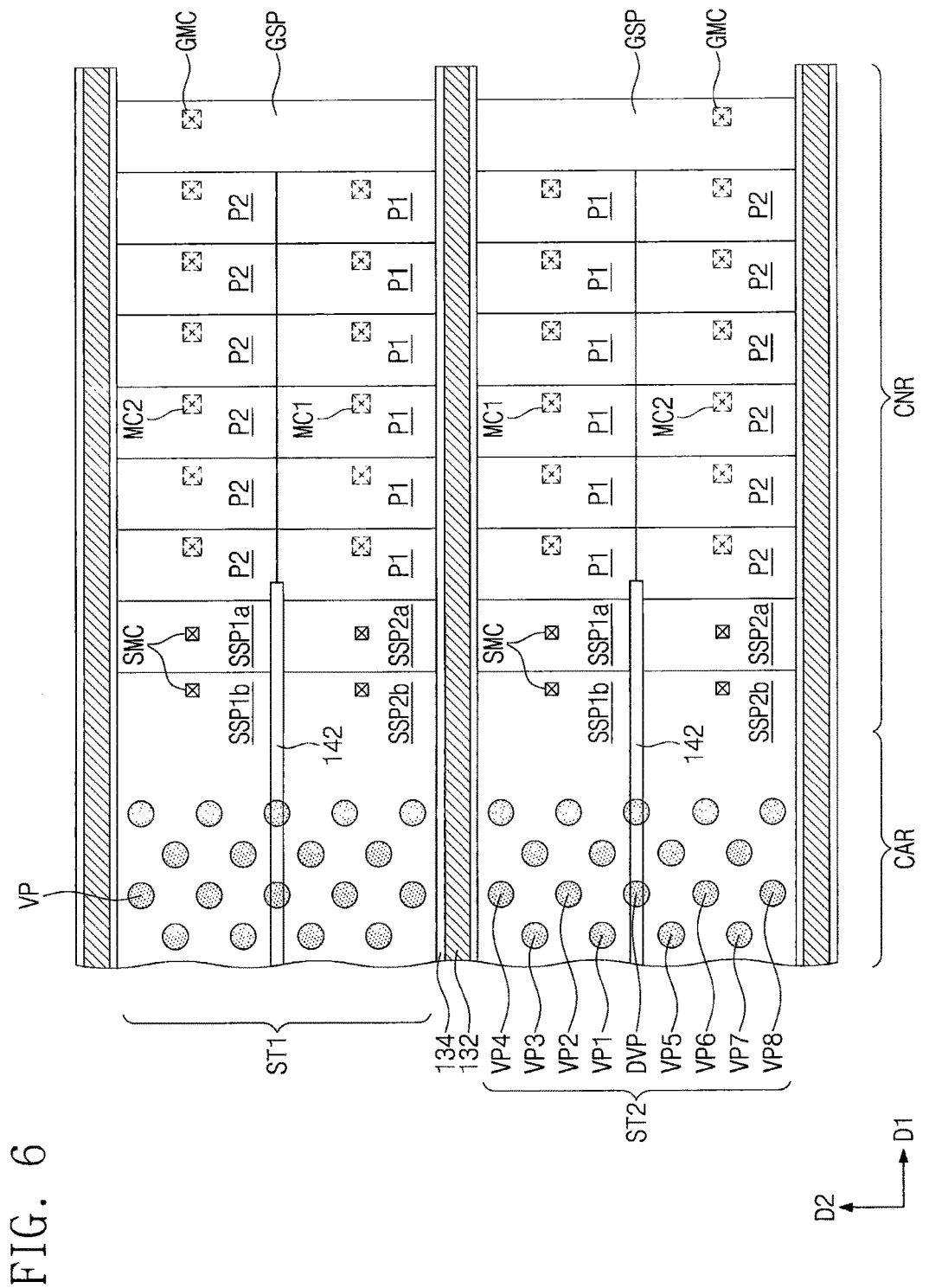
FIG. 6 is a plan view illustrating a stair-step structure of the stacks shown in FIG. 5.
Figure 7:
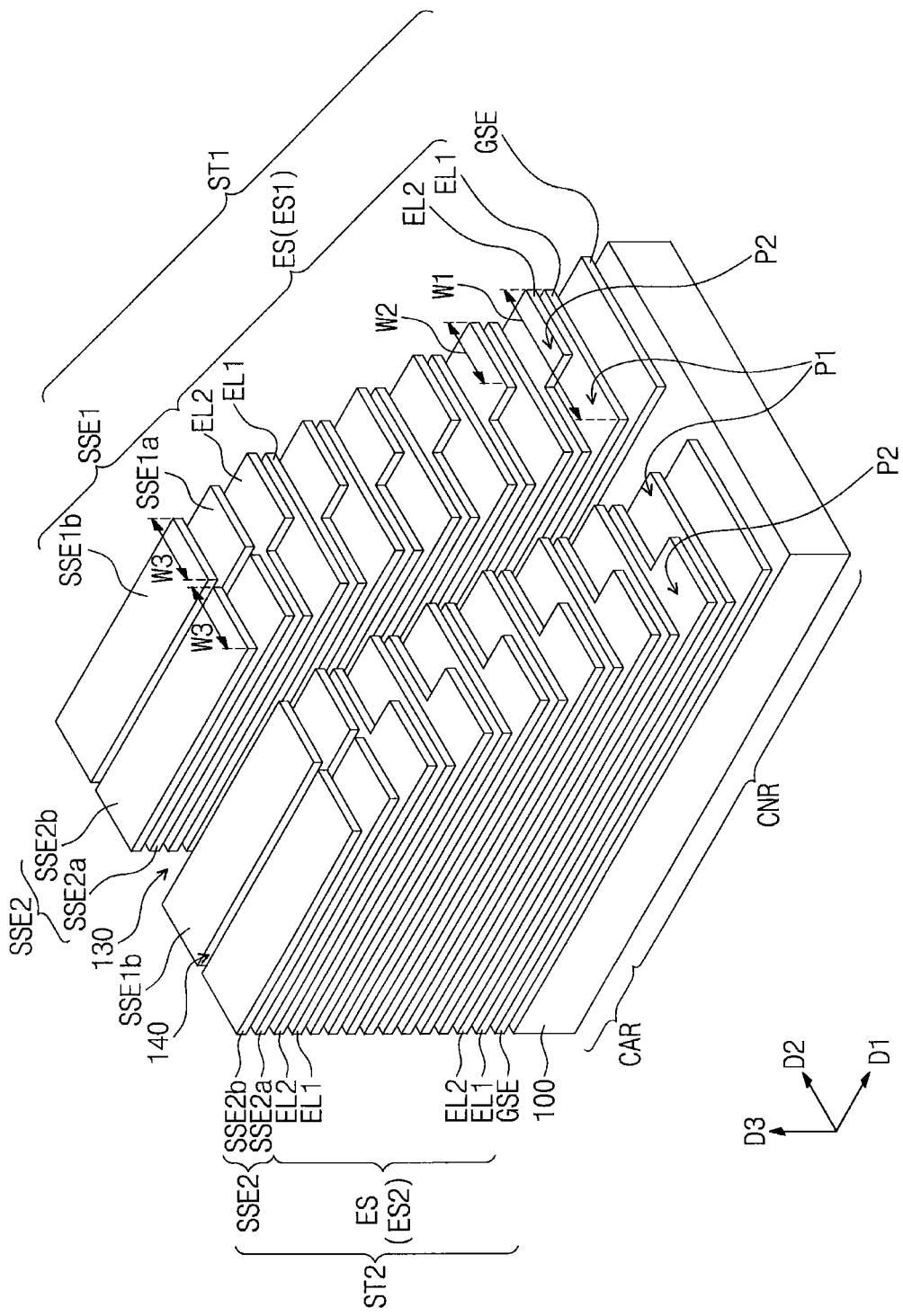
FIG. 7 is a perspective view illustrating a stair-step structure of the stacks shown in FIG. 5.

FIG. 6 is a plan view illustrating a stair-step structure of the stacks shown in FIG. 5. FIG. 7 is a perspective view illustrating a stair-step structure of the stacks shown in FIG. 5.

Figure 8:
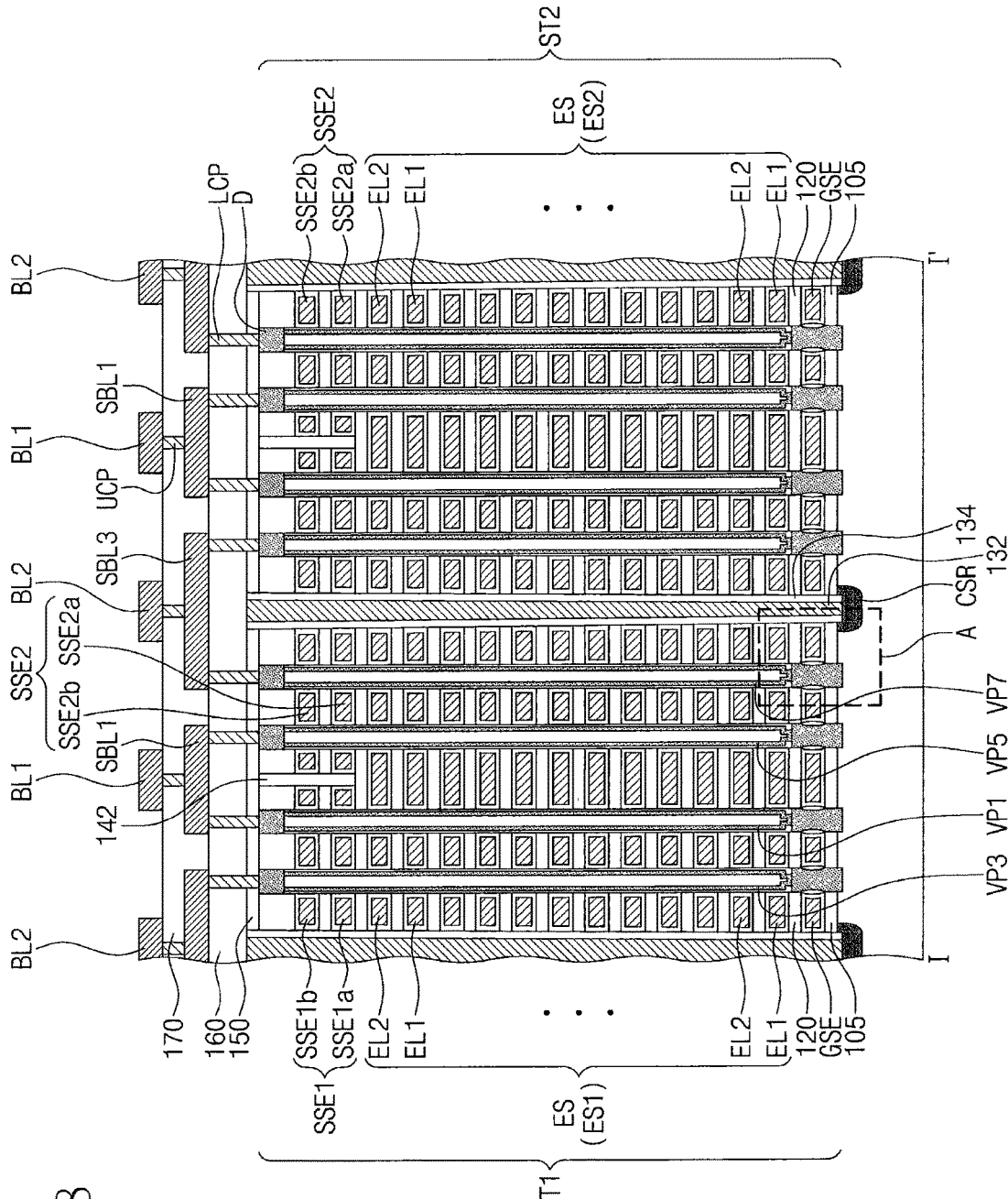
FIGS. 8 and 9 are cross-sectional views, which are taken along lines I-I' and II-II', respectively, of FIG. 4 to illustrate a semiconductor device according to some embodiments of present inventive concepts.
Figure 9:
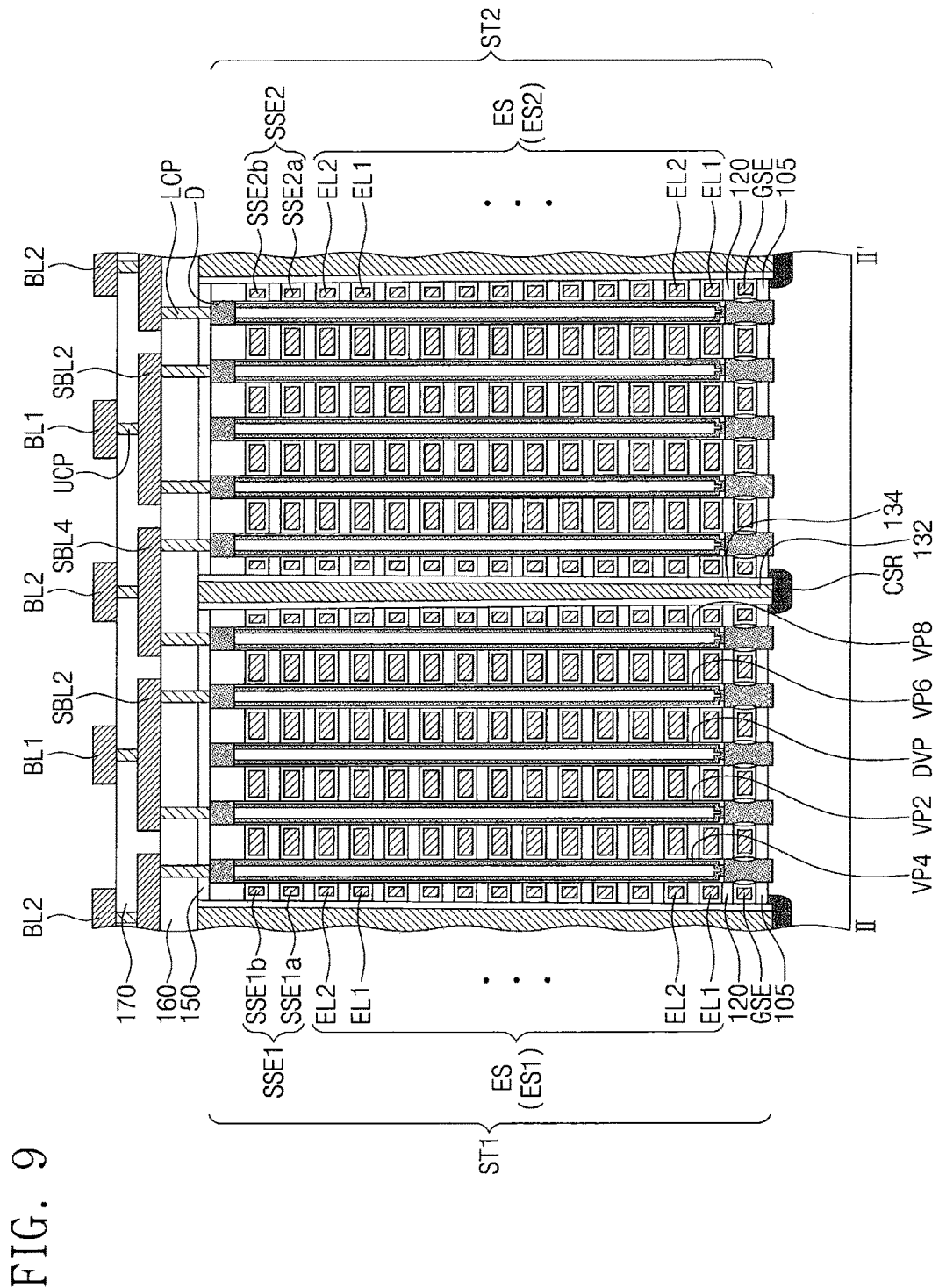
Figure 10A:
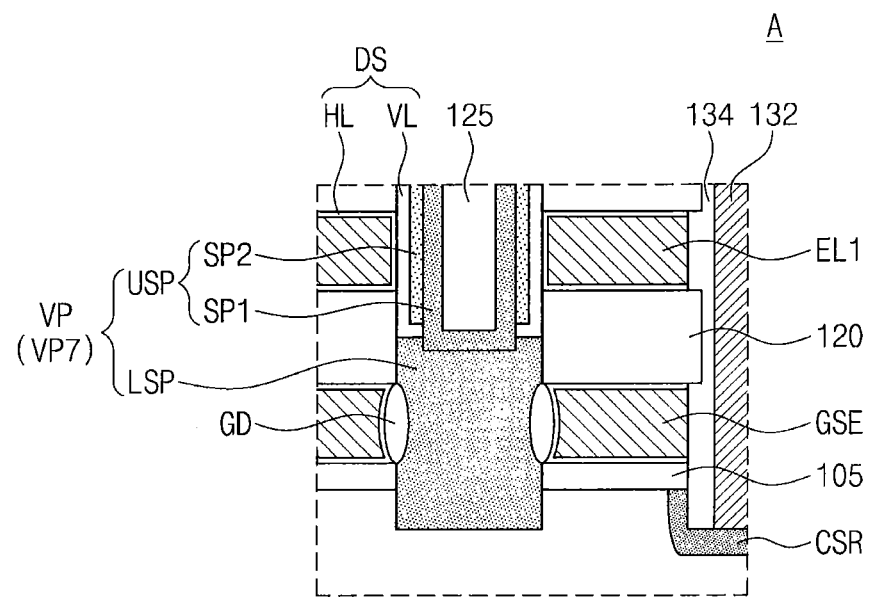
FIGS. 10A and 10B are enlarged sectional views of a portion 'A' of FIG. 8.
Figure 10B:
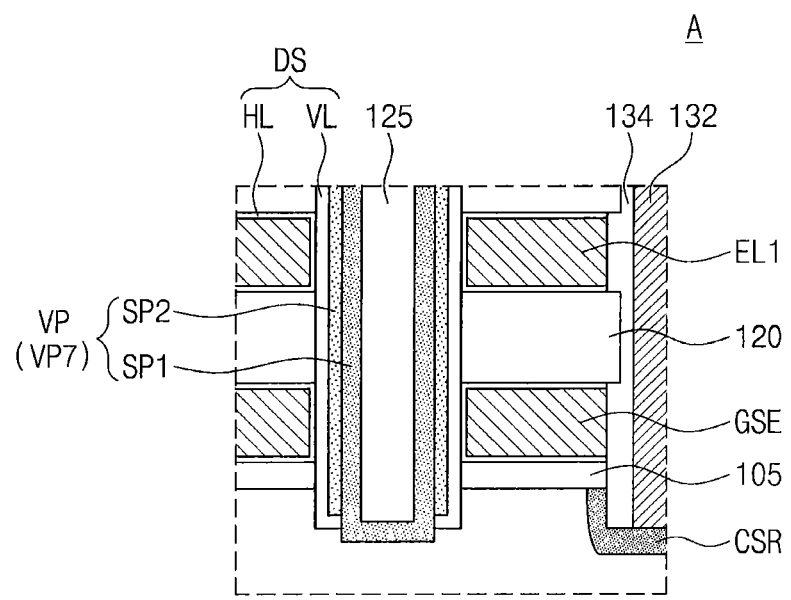

FIGS. 8 and 9 are cross-sectional views, which are taken along lines I-I' and II-II', respectively, of FIG. 4 to illustrate a semiconductor device according to some embodiments of present inventive concepts. FIGS. 10A and 10B are enlarged sectional views of a portion 'A' of FIG. 8.

Figure 11:
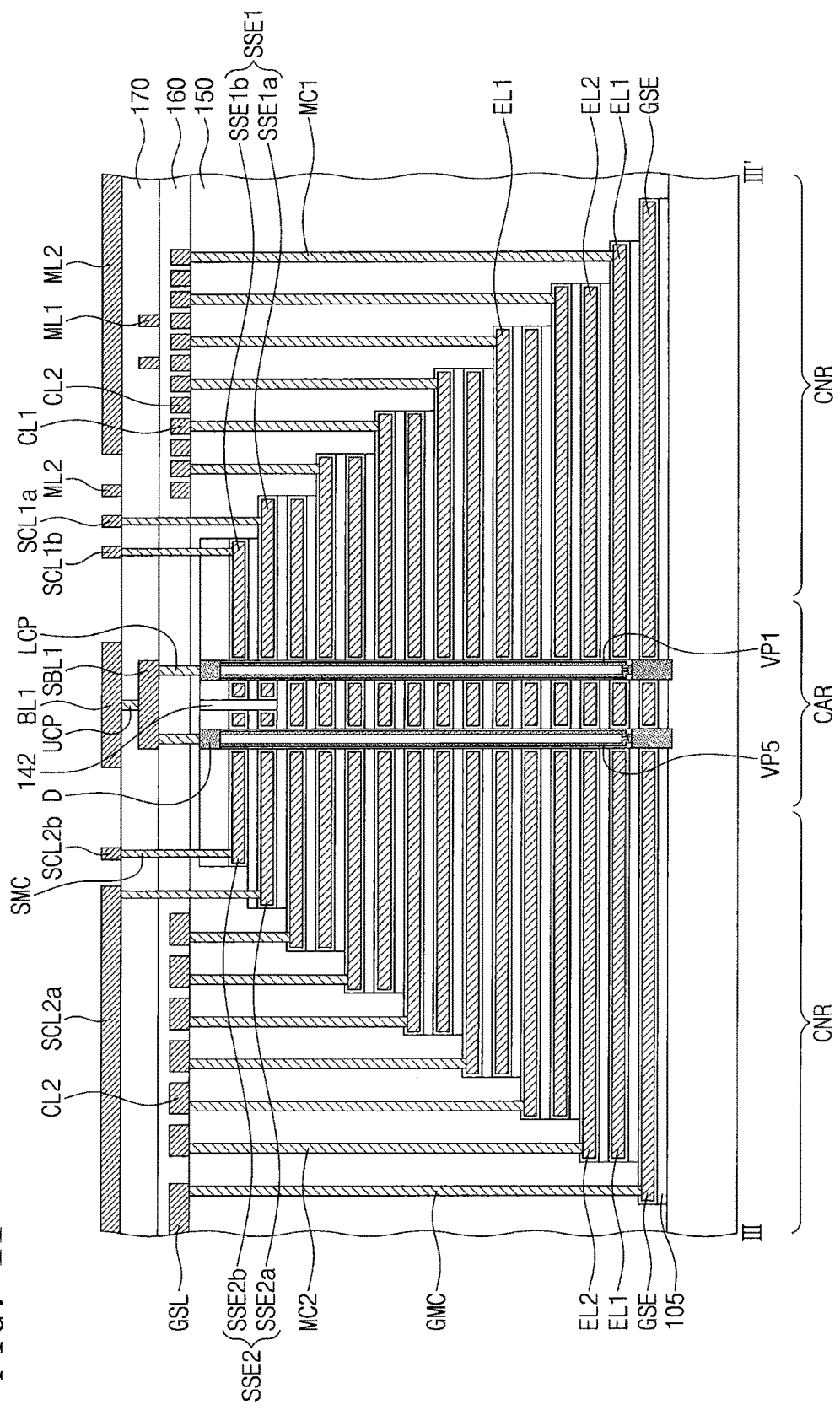
FIG. 11 is a cross-sectional view, which is taken along line III-III' of FIG. 5 to illustrate a semiconductor device according to some embodiments of present inventive concepts.

FIG. 11 is a cross-sectional view, which is taken along line III-III' of FIG. 5 to illustrate a semiconductor device according to some embodiments of present inventive concepts.

Figure 12:
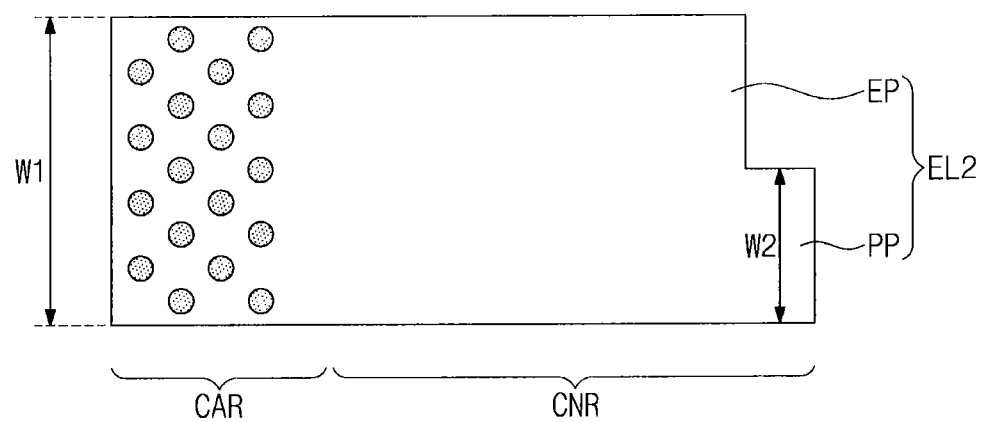
FIG. 12 is a plan view illustrating a second electrode, which is used as a part of an electrode structure of a semiconductor device according to some embodiments of present inventive concepts.

FIG. 12 is a plan view illustrating a second electrode, which is used as a part of an electrode structure of a semiconductor device according to some embodiments of present inventive concepts.

Referring to FIGS. 4 to 9 and 11, a substrate 100 including a cell array region CAR and a connection region CNR may be provided. The substrate 100 may be a semiconductor substrate of a first conductivity type (e.g., a p-type). The semiconductor substrate may include at least one of a single crystalline silicon layer, a silicon on insulator (SOI) wafer, a silicon layer formed on a silicon germanium (SiGe) layer, a single crystalline silicon layer formed on an insulating layer, and a poly crystalline silicon layer formed on an insulating layer.

First and second stacks ST1 and ST2 may be provided on the substrate 100. The first and second stacks ST1 and ST2 may extend in a first direction D1 and may be spaced apart from each other in a second direction D2 across or perpendicular to the first direction D1, as shown in FIGS. 4 to 7. In other words, the first and second stacks ST1 and ST2 may extend from the cell array region CAR to the connection region CNR and may be spaced apart from each other in the second direction D2 by a first separation region 130, which is formed to extend in the first direction D1. A common source plug 132 and insulating sidewall spacers 134 may be provided in the first separation region 130. The common source plug 132 and the insulating sidewall spacers 134 will be described in more detail below.

The first and second stacks ST1 and ST2 may have substantially the same structure. For example, each of the first and second stacks ST1 and ST2 may include insulating layers 120 and electrodes, which are alternatingly stacked in a third direction D3 perpendicular to a top surface of the substrate 100. The electrodes may include a ground selection electrode GSE adjacent to the substrate 100, string selection electrodes SSE1 and SSE2 on the ground selection electrode GSE, and first and second electrodes EL1 and EL2 alternatingly stacked between the ground selection electrode GSE and the string selection electrodes SSE1 and SSE2. The first and second electrodes EL1 and EL2, which are alternatingly stacked, will be referred to as an 'electrode structure ES'. Hereinafter, the first and second electrodes EL1 and EL2 of the first stack ST1 will be referred to as a 'first electrode structure ES1', and the first and second electrodes EL1 and EL2 of the second stack ST2 will be referred to as a 'second electrode structure ES2'.

The electrodes may be formed of or include a conductive material. For example, the electrodes may include at least one of doped semiconductor (e.g., doped silicon and so forth), metals (e.g., tungsten, copper, aluminum, and so forth), conductive metal nitrides (e.g., titanium nitride, tantalum nitride, and so forth), or transition metals (e.g., titanium, tantalum, and so forth). The insulating layers 120 may be, for example, a silicon oxide layer. An insulating buffer layer 105 may be provided between the substrate 100 and the stacks ST1 and ST2. The insulating buffer layer 105 may be a silicon oxide layer. The insulating buffer layer 105 may be thinner than the insulating layers 120.

The string selection electrodes SSE1 and SSE2 may be spaced apart from each other in the second direction D2 by a second separation region 140. In other words, the string selection electrodes SSE1 and SSE2 may include a first string selection electrode SSE1 and a second string selection electrode SSE2, which are provided on/in the electrode structure ES and are separated from each other in the second direction D2. An insulating separation layer 142 may be provided in the second separation region 140.

In some embodiments, the first string selection electrode SSE1 may include first lower and upper string selection electrodes SSE1a and SSE1b stacked on/in the electrode structure ES, and the second string selection electrode SSE2 may include second lower and upper string selection electrodes SSE2a and SSE2b stacked on/in the electrode structure ES. The second separation region 140 may be provided to separate the first and second string selection electrodes SSE1 and SSE2 from each other but not to separate the first and second electrodes EL1 and EL2 thereunder. In other words, the insulating separation layer 142 may have a bottom surface that is higher than a top surface of the uppermost one of the second electrodes EL2 and is substantially equal to or lower than bottom surfaces of the first and second lower string selection electrodes SSE1a and SSE2a.

The first and second electrodes EL1 and EL2 may serve as the word lines WL0-WLn that are connected to the memory cells MCT (of FIG. 3) described with reference to FIG. 3. Also, the first and second lower string selection electrodes SSE1a and SSE2a may serve as the first string selection lines SSL1 that are connected to the first string selection transistors SST1 described with reference to FIG. 3, and the first and second upper string selection electrodes SSE1b and SSE2b may serve as the second string selection lines SSL2 that are connected to the second string selection transistors SST2 described with reference to FIG. 3. The ground selection electrode GSE may serve as the ground selection line GSL that is connected to the ground selection transistors GST described with reference to FIG. 3.

Each of the stacks ST1 and ST2 may have a stair-step structure on the connection region CNR. In other words, on the connection region CNR, a height of each of the stacks ST1 and ST2 may decrease in a stepwise manner with increasing distance from the cell array region CAR (i.e., in the first direction D1). In some embodiments, on the connection region CNR, the number of the electrodes constituting each stair layer may be different. For example, on the connection region CNR, each of the first lower and upper string selection electrodes SSE1a and SSE1b, the second lower and upper string selection electrodes SSE2a and SSE2b, and the ground selection electrode GSE may constitute a single stair layer. By contrast, in the case of the electrode structure ES, a pair of the first and second electrodes EL1 and EL2, which are sequentially stacked, may constitute a single stair layer. That is, in the case of the electrode structure ES, two electrodes on the connection region CNR may constitute a single stair layer. In addition, the first and second electrodes EL1 and EL2 constituting a single stair layer may be disposed to constitute a single stair shape in the second direction D2 or a direction opposite to the second direction D2.

In detail, referring to FIGS. 6, 7, and 12, on the connection region CNR, each of the first electrodes EL1 may have a first pad region P1 exposed by the second electrode EL2 thereon, and each of the second electrodes EL2 may have a second pad region P2 exposed by the first electrode EL1 thereon. When viewed in a plan view, the first pad regions P1 of the first electrodes EL1 may be arranged in the first direction D1, and the second pad regions P2 of the second electrodes EL2 may also be arranged in the first direction D1. In other words, the first pad regions P1 of the first electrodes EL1 may be different from each other in terms of their horizontal and vertical positions. Similarly, the second pad regions P2 of the second electrodes EL2 may also be different from each other in terms of their horizontal and vertical positions. The first pad regions P1 of the first electrodes EL1 may be adjacent to the second pad regions P2 of the second electrodes EL2 in the second direction D2.

In some aspects of present inventive concepts, each of the first electrodes EL1 may be a line shaped structure extending from the cell array region CAR to the connection region CNR with a uniform width. For example, the first electrodes EL1 may have a first width W1. Lengths of the first electrodes EL1 in the first direction D1 may decrease with increasing vertical distance from the substrate 100. As shown in FIG. 12, each of the second electrodes EL2 may include an electrode portion EP, which extends from the cell array region CAR to the connection region CNR with a uniform width, and a protruding portion PP, which is laterally extended from the electrode portion EP and has a smaller width than that of the electrode portion EP. For example, the electrode portion EP of the second electrode EL2 may have substantially the same width as the first width W1 of the first electrode EL1, and the protruding portion PP may have a second width W2 that is smaller than the first width W1. Lengths of the second electrodes EL2 in the first direction D1 may decrease with increasing vertical distance from the substrate 100. Here, the protruding portion PP of each of the second electrodes EL2 may have a sidewall that is aligned with a sidewall of the first electrode EL1 thereunder. Accordingly, the end portion of each of the first electrodes EL1 may be partially exposed by the protruding portion PP of the second electrode EL2 disposed directly thereon. Also, the protruding portion PP of each of the second electrodes EL2 may be exposed by the first electrode EL1 disposed directly thereon. For example, the first pad regions P1 may be portions of the end portions of the first electrodes EL1 exposed by the second electrodes EL2 and may be spaced apart from each other in the vertical and horizontal directions. Similarly, the second pad regions P2 may be portions of the protruding portions PP of the second electrodes EL2 and may be spaced apart from each other in the vertical and horizontal directions.

Owing to the afore-described structures of the first and second electrodes EL1 and EL2, the electrode structure ES may have a first stair-step structure, which is defined by the first pad regions P1 of the first electrodes EL1, and a second stair-step structure, which is defined by the second pad regions P2 of the second electrodes EL2. On the connection region CNR, the first stair-step structure may have a plurality of stair layers whose levels are decreased in a stepwise manner in the first direction D1. Similarly, on the connection region CNR, the second stair-step structure may have a plurality of stair layers whose levels are decreased in a stepwise manner in the first direction D1. Furthermore, the second stair-step structure may be adjacent to the first stair-step structure in the second direction D2. Here, the second pad region P2 and the first pad region P1, which are located at substantially the same distance from the cell array region CAR in the first direction D1 and are adjacent to each other in the second direction D2, may be provided to form a single stair shape in the second direction D2.

In some embodiments, the first stair-step structure of the first electrode structure ES1 may be provided on the substrate 100 to be adjacent to the first stair-step structure of the second electrode structure ES2 in the second direction D2. That is, the first pad regions P1 of the first electrode structure ES1 may be adjacent to the first pad regions P1 of the second electrode structure ES2 in the second direction D2. In other words, the first and second electrode structures ES1 and ES2, which are disposed on the connection region CNR to be adjacent to each other in the second direction D2, may be disposed to have mirror symmetry about an imaginary plane parallel to the first direction D1. The first and second electrode structures ES1 and ES2, which are provided to have the mirror symmetry, may constitute one of the memory blocks described with reference to FIG. 2. As described with reference to FIG. 2, a plurality of the memory blocks may be provided on the substrate 100, and the plurality of memory blocks may be arranged in the second direction D2.

Each of the first and second string selection electrodes SSE1 and SSE2 may extend from the cell array region CAR to the connection region CNR and may have a uniform width. On the connection region CNR, each of the first and second string selection electrodes SSE1 and SSE2 may expose the first and second pad regions P1 and P2 of the electrode structure ES. Also, the first and second upper string selection electrodes SSE1b and SSE2b may expose end portions of the first and second lower string selection electrodes SSE1a and SSE2a, on the connection region CNR. End portions of the first and second lower string selection electrodes SSE1a and SSE2a exposed by the first and second upper string selection electrodes SSE1b and SSE2b may be referred to as 'first and second lower string selection pads SSP1a and SSP2a', respectively. The end portions of the first and second upper string selection electrodes SSE1b and SSE2b on the connection region CNR may be referred to as 'first and second upper string selection pads SSP1b and SSP2b', respectively. Each of the first and second string selection electrodes SSE1 and SSE2 may have a third width W3 that is smaller than the first width W1 of the first electrodes EL1. In some embodiments, the third width W3 may be smaller than the second width W2 that is the width of the protruding portions PP of the second electrodes EL2.

The ground selection electrode GSE may have an end portion that is positioned on the connection region CNR and is exposed by the electrode structure ES (i.e., exposed by the lowermost one of the first electrodes EL1). The end portion of the ground selection electrode GSE exposed by the electrode structure ES may be referred to as a 'ground selection pad GSP'.

Referring back to FIGS. 4 to 9 and 11, a plurality of vertical pillars VP may be provided on the cell array region CAR to penetrate each of the stacks ST1 and ST2 and to be connected to the substrate 100. In other words, the vertical pillars VP may have a longitudinal axis that is normal to the top surface of the substrate 100 or parallel to the third direction D3. The vertical pillars VP may have bottom portions connected to the substrate 100 and may have opposite ends connected to bit lines BL1 and BL2. The vertical pillars VP may be coupled to electrodes. A conductive pad D and a lower contact plug LCP may be sequentially provided on the vertical pillars VP and may be connected to each other.

The vertical pillars VP may be disposed to form a zigzag arrangement in the first direction D1 and/or the second direction D2. For example, the vertical pillars VP may include first to eighth vertical pillars VP1, VP2, VP3, VP4, VP5, VP6, VP7, and VP8, which are disposed to form a zigzag arrangement in the second direction D2. Here, the first to fourth vertical pillars VP1-VP4 may be coupled to the first string selection electrode SSE1, and the fifth to eighth vertical pillars VP5-VP8 may be coupled to the second string selection electrode SSE2. The first to eighth vertical pillars VP1-VP8 may be provided to constitute a plurality of columns, each of which includes some of the vertical pillars VP arranged in the first direction D1.

In detail, as shown in FIG. 4, the first vertical pillars VP1 may be arranged in the first direction D1 to constitute a first column, and the second vertical pillars VP2 may be arranged in the first direction D1 to constitute a second column. The third vertical pillars VP3 may be arranged in the first direction D1 to constitute a third column, and the fourth vertical pillars VP4 may be arranged in the first direction D1 to constitute a fourth column. The first to fourth columns may be arranged in the second direction D2. The first and third vertical pillars VP1 and VP3 may be arranged in a diagonal direction with respect to the second and fourth vertical pillars VP2 and VP4. Similarly, the fifth to eighth vertical pillars VP5-VP8 may be arranged in the first direction D1 to constitute fifth to eighth columns, respectively. The fifth and seventh vertical pillars VP5 and VP7 may be arranged in a diagonal direction with respect to the sixth and eighth vertical pillars VP6 and VP8. When viewed in a plan view, the first to fourth vertical pillars VP1-VP4 penetrating the first string selection electrode SSE1 and the fifth to eighth vertical pillars VP5-VP8 penetrating the second string selection electrode SSE2 may be disposed to have a mirror symmetry with respect to the insulating separation layer 142 interposed therebetween. For example, the first vertical pillar VP1 and the fifth vertical pillar VP5 may be adjacent to each other in the second direction D2 with the insulating separation layer 142 interposed therebetween.

Furthermore, on the cell array region CAR, dummy vertical pillars DVP may be provided to penetrate the stacks ST1 and ST2. In each of the stacks ST1 and ST2, the dummy vertical pillars DVP may be arranged to be spaced apart from each other in the first direction D1 and may be disposed between the first and second string selection electrodes SSE1 and SSE2. Also, the dummy vertical pillars DVP on the cell array region CAR may be provided to penetrate the insulating separation layer 142. Each of the dummy vertical pillars DVP may be disposed between the second vertical pillar VP2 and the sixth vertical pillar VP6, which are adjacent to each other in the second direction D2, and may be arranged in a diagonal direction with respect to the first and fifth vertical pillars VP1 and VP5. In some embodiments, the dummy vertical pillars DVP may also be provided to penetrate the stacks ST1 and ST2 on the connection region CNR.

The vertical pillars VP may be formed of or include a semiconductor material or a conductive material. In some embodiments, each of the vertical pillars VP may include a lower semiconductor pattern LSP and an upper semiconductor pattern USP, as shown in FIG. 10A. As an example, the lower and upper semiconductor patterns LSP and USP may be formed of or include at least one of doped or intrinsic semiconductor materials (e.g., of silicon (Si), germanium (Ge), or compounds thereof) and may have different crystal structures. The lower and upper semiconductor patterns LSP and USP may have one of polycrystalline, amorphous, and single-crystalline structures. The lower and upper semiconductor patterns LSP and USP may be in an undoped state or may be doped to have the same conductivity type as the substrate 100.

The lower semiconductor pattern LSP may be provided to penetrate the ground selection electrode GSE and to be in direct contact with the substrate 100. Also, the lower semiconductor pattern LSP may include a bottom portion that is inserted into the substrate 100. The upper semiconductor pattern USP may include a first semiconductor pattern SP1 and a second semiconductor pattern SP2. The first semiconductor pattern SP1 may be coupled to the lower semiconductor pattern LSP and may have a pipe or macaroni shape with closed bottom and open top. An inner space of the first semiconductor pattern SP1 may be filled with an insulating gapfill layer 125. In addition, the first semiconductor pattern SP1 may be in contact with an inner surface of the second semiconductor pattern SP2 and a top surface of the lower semiconductor pattern LSP. In other words, the first semiconductor pattern SP1 may connect the second semiconductor pattern SP2 electrically with the lower semiconductor pattern LSP. The second semiconductor pattern SP2 may be a pipe or macaroni structure with open top and bottom. The second semiconductor pattern SP2 may be spaced apart from (i.e., in-non-contact with) the lower semiconductor pattern LSP. For example, a gate insulating layer GD may be interposed between the lower semiconductor pattern LSP and the ground selection electrode GSE. The gate insulating layer GD may be, for example, a silicon oxide layer.

In some embodiments, the lower semiconductor pattern LSP of the vertical pillars VP may not be provided (i.e., it may be omitted). In other words, the vertical pillars VP may include the first and second semiconductor patterns SP1 and SP2, as shown in FIG. 10B. The first semiconductor patterns SP1 may be provided to penetrate the ground selection electrode GSE and to be in direct contact with the substrate 100. Also, the first semiconductor pattern SP1 may be in contact with the inner surface of the second semiconductor pattern SP2 and the top surface of the substrate 100. In other words, the first semiconductor pattern SP1 may be provided to electrically connect the second semiconductor pattern SP2 to the substrate 100. A bottom surface of the first semiconductor pattern SP1 may be positioned at a level lower than that of the top surface of the substrate 100.

The dummy vertical pillars DVP may be substantially the same as the vertical pillars VP in terms of their material and structure. For example, the vertical pillars VP and the dummy vertical pillars DVP may have a hollow pipe shape or a macaroni shape. Alternatively, the vertical pillars VP and the dummy vertical pillars DVP may be provided to have a circular pillar shape.

A data storing layer DS may be disposed between the stacks ST1 and ST2 and the vertical pillars VP. As shown in FIG. 10A, the data storing layer DS may include a vertical insulating layer VL penetrating the stacks ST1 and ST2 and a horizontal insulating layer HL, which is disposed between the electrodes and the vertical insulating layer VL and is extended to cover top and bottom surfaces of the electrodes. In some embodiments, the semiconductor device may be a NAND FLASH memory device. For example, the data storing layer DS may include a tunnel insulating layer, a charge storing layer, and a blocking insulating layer. Data stored in the data storing layer DS may be changed using a Fowler-Nordheim FN tunneling effect, which may be caused by a voltage difference between the vertical pillars VP and the electrodes.

A common source region CSR may be provided in the substrate 100 and between the first and second stacks ST1 and ST2. The common source region CSR may extend in the first direction D1 or parallel to the first and second stacks ST1 and ST2. The common source regions CSR may be formed by doping the substrate 100 with impurities of a second conductivity type. For example, the common source regions CSR may contain n-type impurities (e.g., arsenic (As) or phosphorus (P)).

The common source plug 132 may be coupled to the common source region CSR, and the insulating sidewall spacer 134 may be interposed between the common source plug 132 and the first and second stacks ST1 and ST2. As an example, the common source plug 132 may have a substantially uniform top width and may extend in the first direction D1. The insulating sidewall spacers 134 may be provided to face each other between the first and second stacks ST1 and ST2 adjacent to each other. In some embodiments, the insulating sidewall spacer 134 may be provided to fill the first separation region 130, and the common source plug 132 may be provided to penetrate the insulating sidewall spacer 134 and to be locally coupled to the common source region CSR. In other words, the common source plug 132 may be provided to have a pillar shape, unlike that illustrated in the drawings.

First and second interlayer insulating layers 150 and 160 may be provided to cover the stacks ST1 and ST2, and first, second, third, and fourth subsidiary lines SBL1, SBL2, SBL3, and SBL4 may be provided on the second interlayer insulating layer 160. In some embodiments, each of the first subsidiary lines SBL1 may connect the first vertical pillar VP1 and the fifth vertical pillar VP5, which are disposed to be adjacent to each other in the second direction D2, through the lower contact plugs LCP. Each of the second subsidiary lines SBL2 may connect the second vertical pillar VP2 and the sixth vertical pillar VP6, which are disposed to be adjacent to each other in the second direction D2, through the lower contact plugs LCP. In some embodiments, the first subsidiary lines SBL1 may be shorter than the second subsidiary lines SBL2.

Each of the third subsidiary lines SBL3 may connect the third vertical pillar VP3 and the seventh vertical pillar VP7, which are disposed to be adjacent to each other in the second direction D2, through the lower contact plugs LCP. Each of the fourth subsidiary lines SBL4 may connect the fourth vertical pillar VP4 and the eighth vertical pillar VP8, which are disposed to be adjacent to each other in the second direction D2, through the lower contact plugs LCP. In some embodiments, the third subsidiary lines SBL3 may be longer than the fourth subsidiary lines SBL4. The first and second subsidiary lines SBL1 and SBL2 may be provided to cross/overlap the insulating separation layer 142, and the third and fourth subsidiary lines SBL3 and SBL4 may be provided to cross/overlap the common source region CSR.

A third interlayer insulating layer 170 may be provided on the second interlayer insulating layer 160 to cover the first to fourth subsidiary lines SBL1-SBL4, and the first and second bit lines BL1 and BL2 may be provided on the third interlayer insulating layer 170. The first and second bit lines BL1 and BL2 may extend in the second direction D2 and may be alternatingly disposed in the first direction D1.

Each of the first bit lines BL1 may be connected to the first subsidiary lines SBL1 or the second subsidiary lines SBL2 through an upper contact plug UCP. Each of the second bit lines BL2 may be connected to the third subsidiary lines SBL3 or the fourth subsidiary lines SBL4 through the upper contact plug UCP. Each of the first to fourth subsidiary lines SBL1-SBL4, the lower and upper contact plugs LCP and UCP, and the first and second bit lines BL1 and BL2 may include a metal material (e.g., tungsten or copper). Each of the first to third interlayer insulating layers 150, 160, and 170 may be formed of or include at least one of a silicon oxide layer, a silicon nitride layer, a silicon oxynitride layer, or low-k dielectric layers having dielectric constants lower than that of silicon oxide.

Referring to FIGS. 5, 6, and 11, on the connection region CNR, contacts GMC, SMC, MC1, and MC2 may be coupled to the end portions of the electrodes. For example, the ground selection contacts GMC may be provided on the connection region CNR to penetrate the first interlayer insulating layer 150 and to be coupled to the ground selection pads GSP, respectively. The string selection contacts SMC may be provided on the connection region CNR to penetrate the first to third interlayer insulating layers 150, 160, and 170 and to be coupled to the lower and upper string selection pads SSP1a, SSP2a, SSP1b, and SSP2b, respectively.

The first contacts MC1 may be provided on the connection region CNR to penetrate the first interlayer insulating layer 150 and to be connected to the first pad regions P1 of the first electrodes EL1, respectively. The second contacts MC2 may be provided on the connection region CNR to penetrate the first interlayer insulating layer 150 and to be connected to the second pad regions P2 of the second electrodes EL2, respectively. In other words, the first contacts MC1 may be provided on the first stair-step structures of the first and second electrode structures ES1 and ES2, and the second contacts MC2 may be disposed on the second stair-step structures of the first and second electrode structures ES1 and ES2. Accordingly, the first contacts MC1 may be arranged to be spaced apart from each other in the first direction D1, and bottom surfaces of the first contacts MC1 may be positioned at different levels from the substrate 100. Similarly, the second contacts MC2 may be arranged to be spaced apart from each other in the first direction D1, and bottom surfaces of the second contacts MC2 may be positioned at different levels from the substrate 100. The first contacts MC1 coupled to the first electrode structure ES1 may be adjacent to ones of the first contacts MC1 that are coupled to the second electrode structure ES2, in the second direction D2. The contacts GMC, SMC, MC1, and MC2 may be formed of or include, for example, tungsten or copper.

Ground selection lines GSL may be provided on the second interlayer insulating layer 160 of the connection region CNR. The ground selection lines GSL may be electrically connected to the ground selection electrodes GSE via the ground selection contacts GMC. The ground selection lines GSL may have a line-shaped structure extending in the first direction D1. The ground selection lines GSL may include, for example, tungsten or copper.

First lower string selection lines SCL1a may be electrically connected to the first lower string selection electrodes SSE1a via the string selection contacts SMC, and second lower string selection lines SCL2a may be electrically connected to the second lower string selection electrodes SSE2a via the string selection contacts SMC. First upper string selection lines SCL1b may be electrically connected to the first upper string selection electrodes SSE1b via the string selection contacts SMC, and second upper string selection lines SCL2b may be electrically connected to the second upper string selection electrodes SSE2b via the string selection contacts SMC. In some embodiments, the first and second lower string selection lines SCL1a and SCL2a and the first and second upper string selection lines SCL2a and SCL2b may be provided on the third interlayer insulating layer 170. In other words, the lower and upper string selection lines SCL1a, SCL2a SCL1b, and SCL2b may be positioned at substantially the same level as (e.g., may be coplanar with) the bit lines BL1 and BL2. But present inventive concepts may not be limited thereto. For example, in some embodiments, the lower and upper string selection lines SCL1a, SCL2a SCL1b, and SCL2b may be positioned at a level lower than those of the bit lines BL1 and BL2. For example, the lower and upper string selection lines SCL1a, SCL2a SCL1b, and SCL2b may be disposed on the second interlayer insulating layer 160.

The lower and upper string selection lines SCL1a, SCL2a SCL1b, and SCL2b may extend in the first direction D1. Some of the lower and upper string selection lines SCL1a, SCL2a SCL1b, and SCL2b may have an 'L'-shaped structure, and others may have a straight-line-shaped structure. The lower and upper string selection lines SCL1a, SCL2a SCL1b, and SCL2b may be formed of or include, for example, tungsten or copper.

In some embodiments, the first contacts MC1 may be connected to each other through first connection lines CL1, and the second contacts MC2 may be connected to each other through second connection lines CL2. In addition, some of the first and second connection lines CL1 and CL2 may be connected to first metal lines ML1, and others may be connected to second metal lines ML2. This will be described in more detail below.

Figure 13:
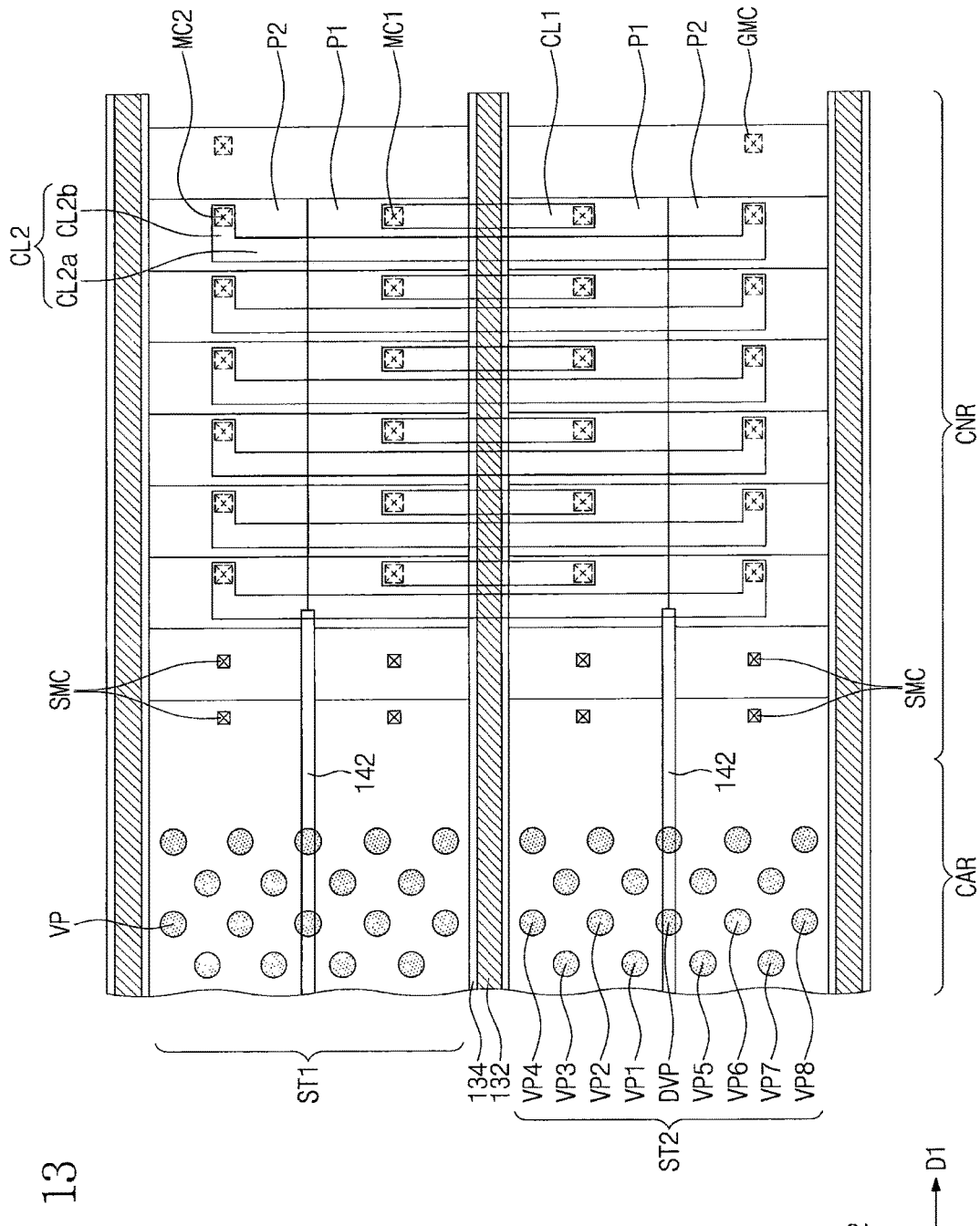
FIGS. 13 and 15 are plan views illustrating connection lines according to some embodiments of present inventive concepts.
Figure 14:
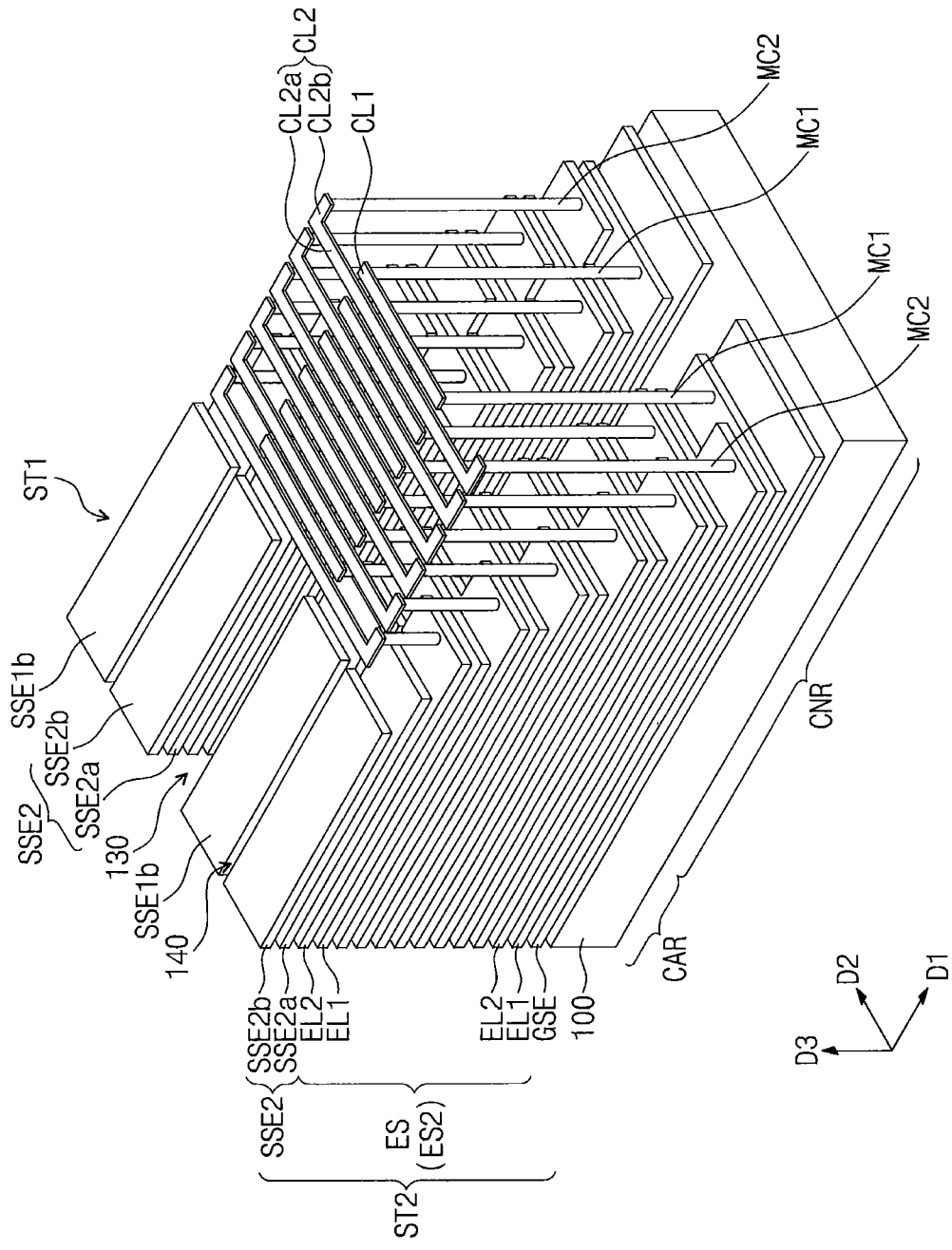
FIG. 14 is a perspective view illustrating connection lines according to some embodiments of present inventive concepts.
Figure 15:
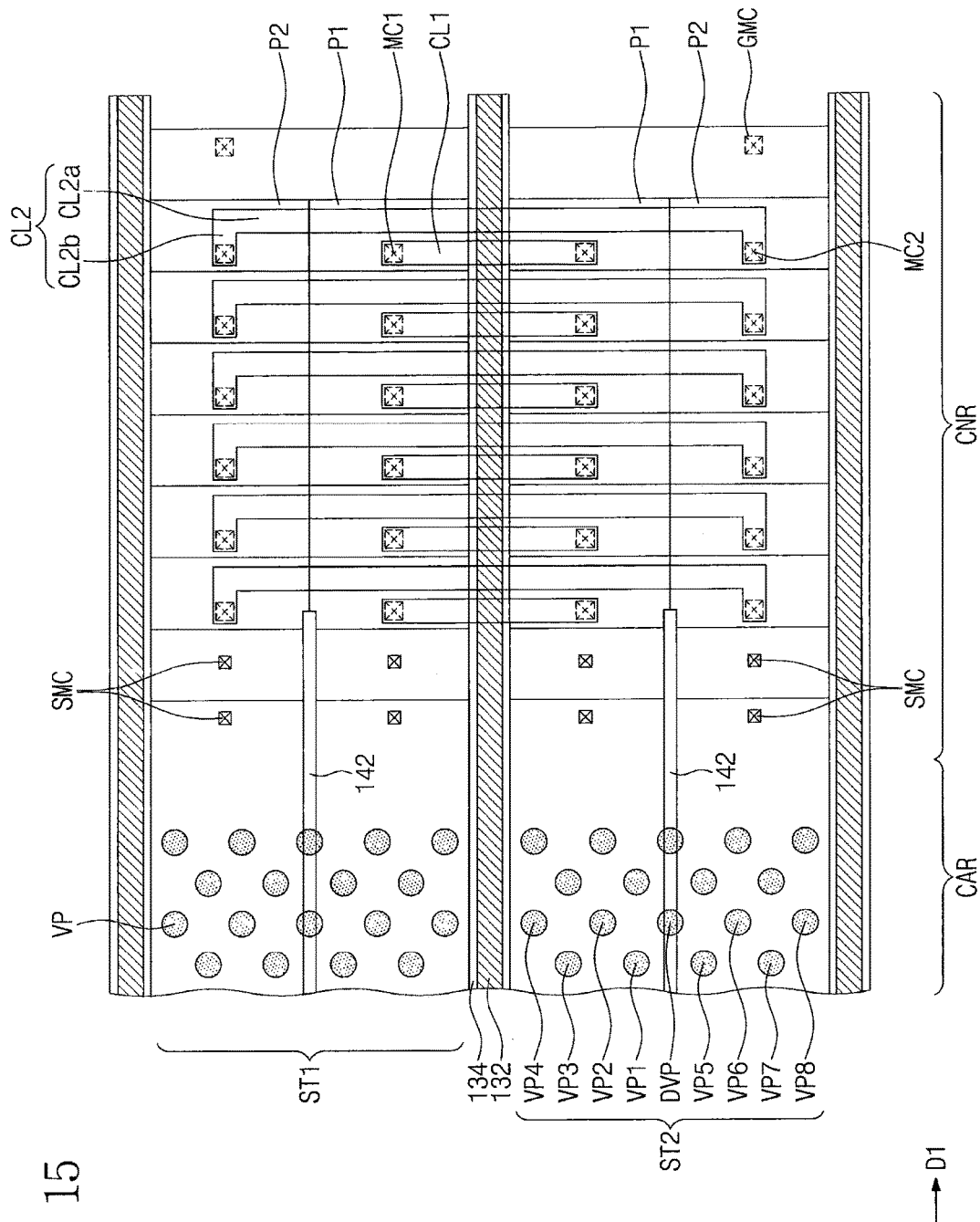

FIGS. 13 and 15 are plan views illustrating connection lines according to some embodiments of present inventive concepts. FIG. 14 is a perspective view illustrating connection lines according to some embodiments of present inventive concepts. In FIGS. 13, 14, and 15, in order to reduce complexity in the drawings and to provide a better understanding of present inventive concepts, some elements of the semiconductor device may be omitted.

Referring to FIGS. 5, 11, 13, and 14, the first and second connection lines CL1 and CL2 may be provided on the stacks ST1 and ST2 and on the connection region CNR. The first and second connection lines CL1 and CL2 may be positioned at substantially the same level (i.e., equidistant) from the substrate 100 (e.g., uppermost surfaces of the first and second connection lines CL1 and CL2 may be coplanar). For example, the first and second connection lines CL1 and CL2 may be disposed on the second interlayer insulating layer 160 of the connection region CNR.

Each of the first connection lines CL1 may be coupled in common to the first contacts MC1 adjacent to each other in the second direction D2, and each of the second connection lines CL2 may be coupled in common to the second contacts MC2 adjacent to each other in the second direction D2. In other words, each of the first connection lines CL1 may connect the first electrodes EL1 of the first and second electrode structures ES1 and ES2, which are positioned at substantially the same vertical distance from the substrate 100, to each other through a corresponding one of the first contacts MC1. Accordingly, the first electrodes EL1 of the first and second electrode structures ES1 and ES2 at the same level (e.g., coplanar) may have substantially the same electric potential. Each of the second connection lines CL2 may connect the second electrodes EL2 of the first and second electrode structures ES1 and ES2, which are positioned at substantially the same vertical distance from the substrate 100, to each other through a corresponding one of the second contacts MC2. In other words, the second electrodes EL2 of the first and second stacks ST1 and ST2 at the same level may have substantially the same electric potential.

In some embodiments, the first and second connection lines CL1 and CL2 may have different shapes, when viewed in a plan view. For example, the first connection lines CL1 may have a line or bar shaped structure extending in the second direction D2. By contrast, each of the second connection lines CL2 may include a first connecting portion CL2a, which has a line or bar shaped structure extending in the second direction D2, and second connecting portions CL2b, which are extended from opposite ends of the first connecting portion CL2a in a direction crossing a length direction of the first connecting portion CL2a or in the first direction D1. In other words, the second connection lines CL2 may be provided to have a concave region. The second contacts MC2 may be coupled to the second connecting portions CL2b.

The first connection lines CL1 and the first connecting portions CL2a of the second connection lines CL2 may be alternatingly disposed in the first direction D1. When measured in the second direction D2, the first connection lines CL1 may be shorter than the first connecting portions CL2a. When measured in the first direction D1, a length of the second connecting portions CL2b may be greater than a space between the first connection line CL1 and the first connecting portion CL2a adjacent to each other and may be smaller than a space between the first connecting portions CL2a adjacent to each other. The first and second connection lines CL and CL2 may include, for example, tungsten or copper (or another conductive/metal material).

In some embodiments, as shown in FIG. 15, the second connecting portions CL2b may be provided to extend from opposite ends of the first connecting portion CL2a in a direction opposite and parallel to the first direction D1 (i.e., toward, rather than away from, the cell array region CAR).

According to some embodiments of present inventive concepts, the electrodes EL1 and EL2 of the first and second electrode structures ES1 and ES2, which are positioned at the same level, may be connected to the first connection line CL1 or the second connection line CL2 through corresponding contacts MC1 or MC2. When viewed in a plan view, the first and second connection lines CL1 and CL2 may be alternatingly and repeatedly disposed and may have shapes different from each other, and this may make it possible to simplify a process of forming the contacts MC1 and MC2 and the connection lines CL1 and CL2. The first electrodes EL1 may be at different levels/heights from the second electrodes EL2. Accordingly, upper surfaces (having first contacts thereon) of the first electrodes EL1 may be non-coplanar with upper surfaces (having second contacts thereon) of the second electrodes EL2.

Figure 16:
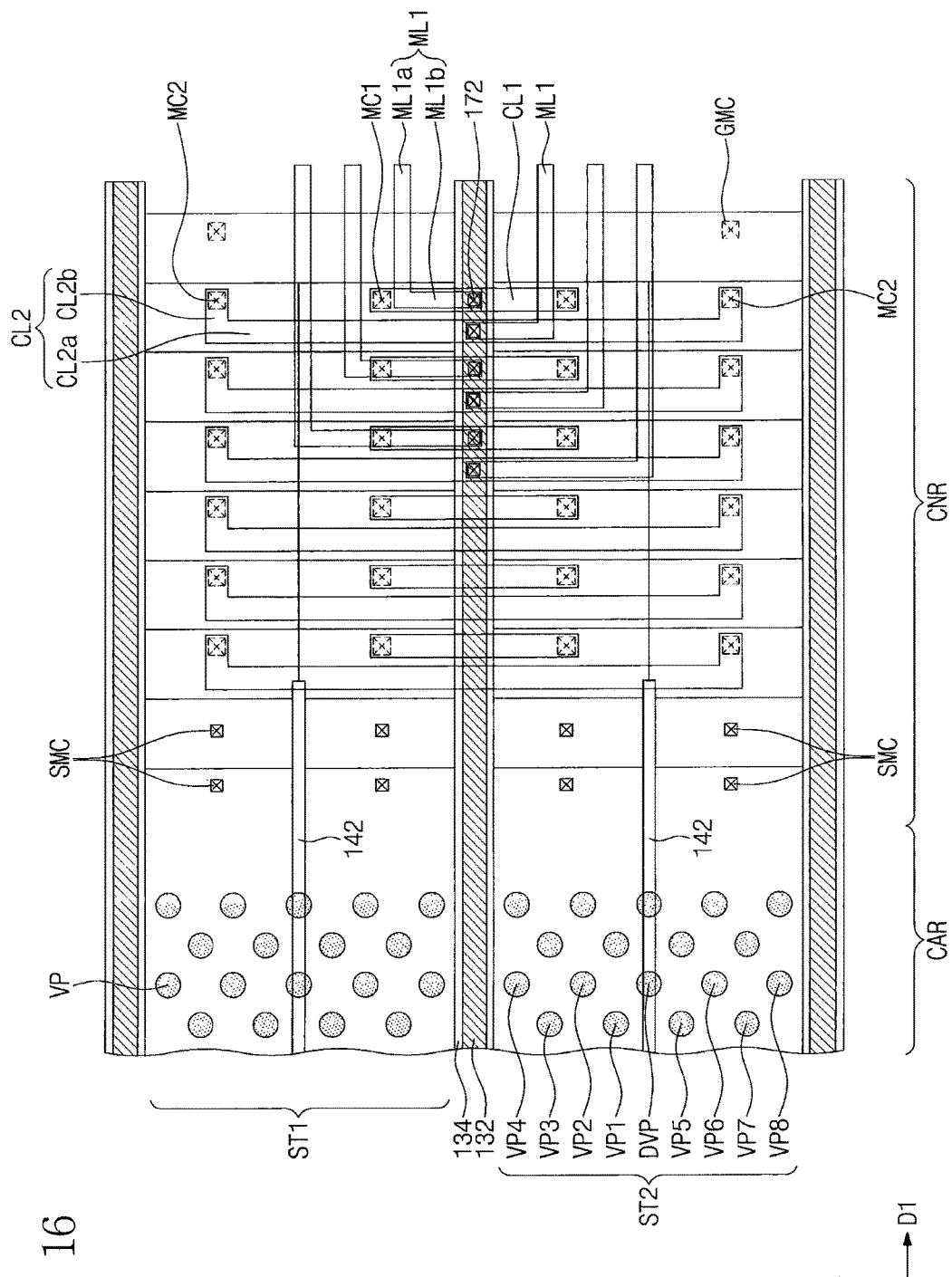
FIGS. 16 and 18 are plan views illustrating metal lines according to some embodiments of present inventive concepts.
Figure 17:
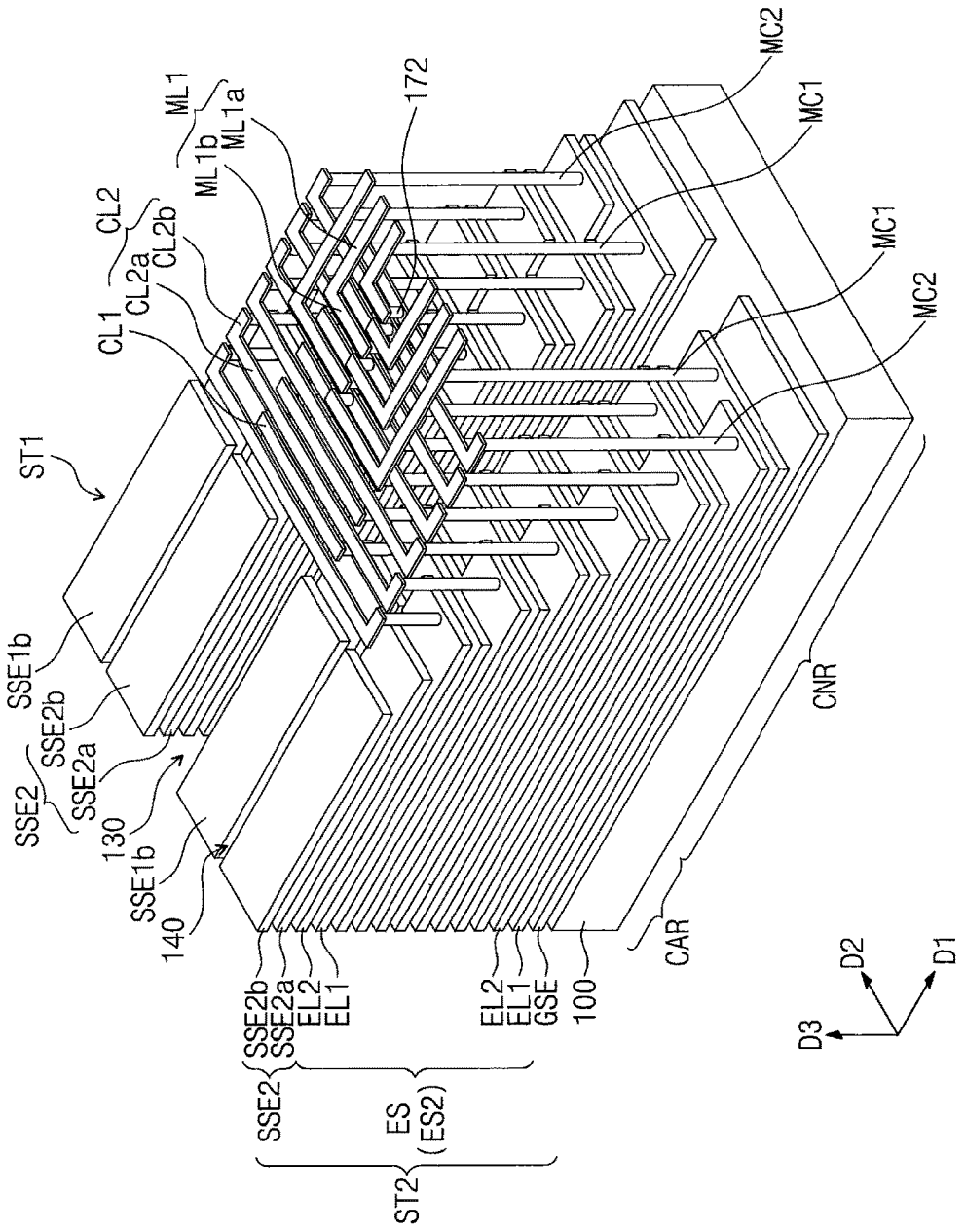
FIGS. 17 and 19 are perspective views illustrating metal lines according to some embodiments of present inventive concepts.
Figure 18:
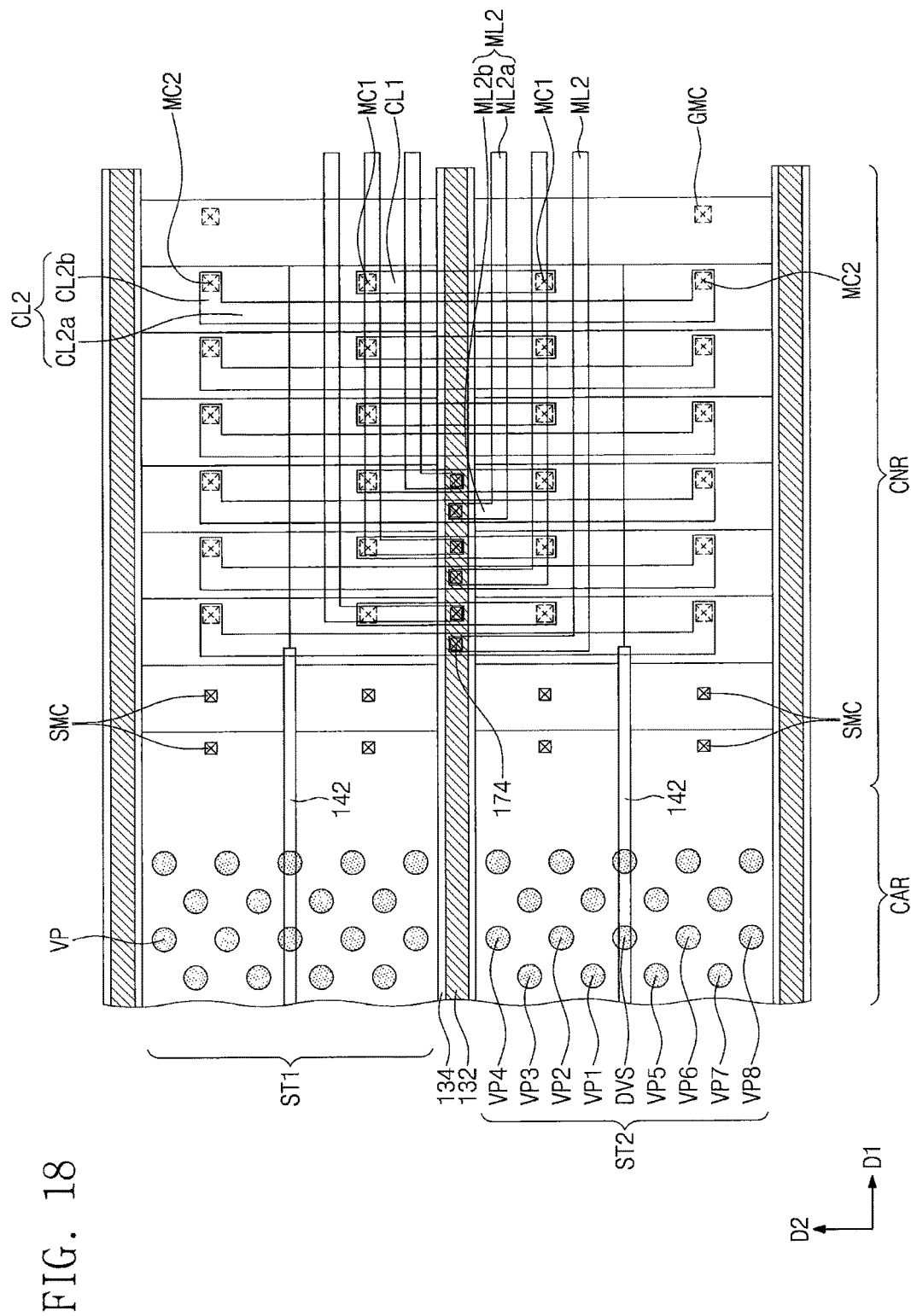
Figure 19:
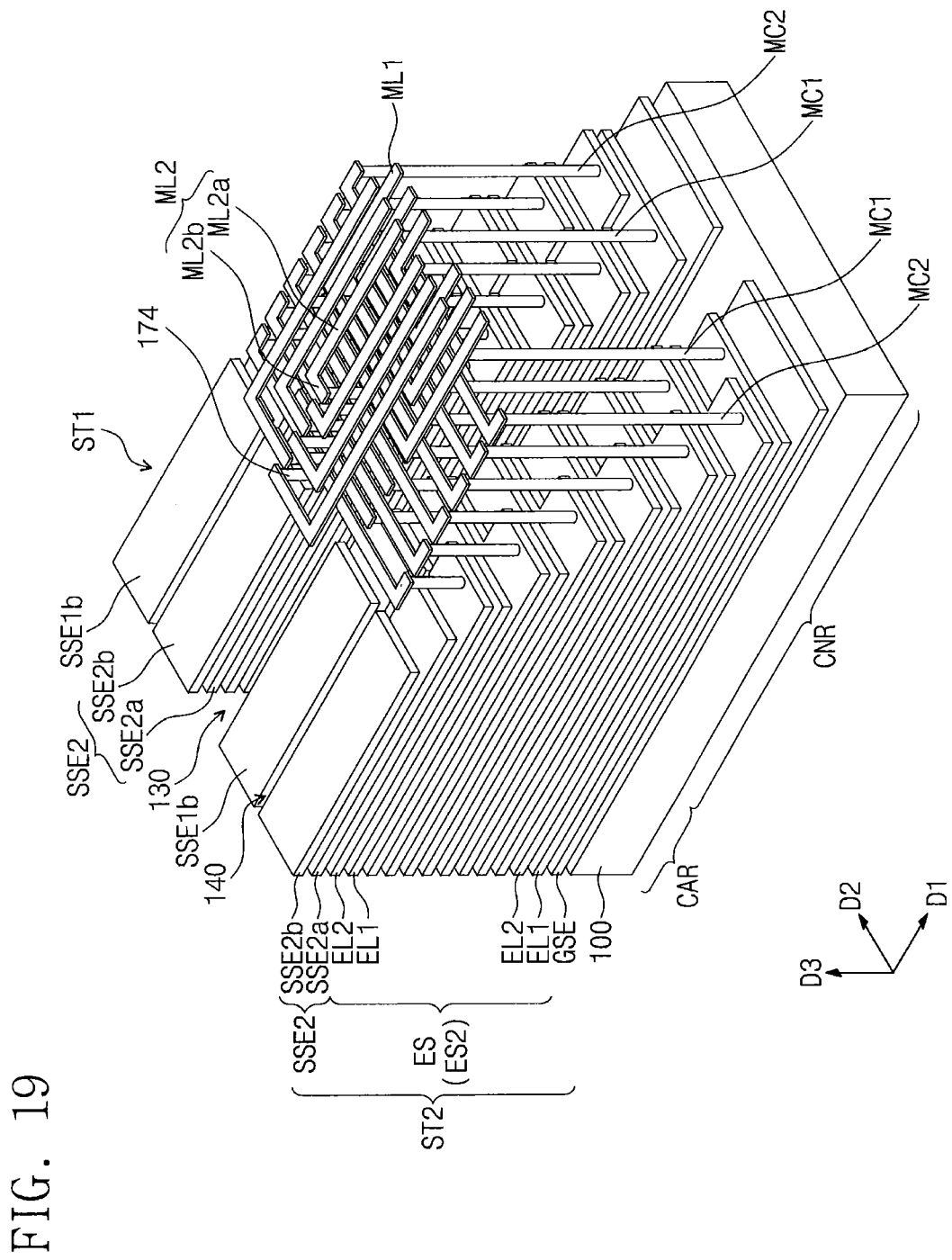

FIGS. 16 and 18 are plan views illustrating metal lines according to some embodiments of present inventive concepts. In detail, FIG. 16 illustrates the first metal lines, and FIG. 18 illustrates the second metal lines. FIGS. 17 and 19 are perspective views illustrating metal lines according to some embodiments of present inventive concepts. In detail, FIG. 17 illustrates the first metal lines, and FIG. 19 illustrates both of the first and second metal lines. In FIGS. 16 to 19, in order to reduce complexity in the drawings and to provide a better understanding of present inventive concepts, some elements of the semiconductor device may be omitted.

Referring to FIGS. 5, 11, and 16 to 19, the first and second metal lines ML1 and ML2 may be provided on the connection lines CL1 and CL2 and on the connection region CNR. The first metal lines ML1 and the second metal lines ML2 may be positioned at different levels from the substrate 100. For example, the first metal lines ML1 may be provided on the second interlayer insulating layer 160, and the second metal lines ML2 may be provided on the third interlayer insulating layer 170. In other words, the first metal lines ML1 may be positioned at a lower level than that of the second metal lines ML2. Accordingly, uppermost surfaces of the first metal lines ML1 may be non-coplanar with uppermost surfaces of the second metal lines ML2.

The first metal lines ML1 may be connected to some of the first and second connection lines CL1 and CL2 through first connection contacts 172, and the second metal lines ML2 may be connected to others of the first and second connection lines CL1 and CL2 through second connection contacts 174. As a result, the electrodes EL1 and EL2, which are included in the first and second electrode structures ES1 and ES2 and are disposed at the same level, may be connected in common to the first metal line ML1 or the second metal line ML2 through corresponding contacts (e.g., MC1 or MC2), corresponding connection lines (CL1 or CL2), and corresponding connection contacts (172 or 174).

In some embodiments, each of the first metal lines ML1 may have an 'L'-shaped structure. For example, as shown in FIGS. 16 and 17, each of the first metal lines ML1 may include a first portion ML1a, which extends in the first direction D1, and a second portion ML1b, which extends from the first portion ML1a in the second direction D2 or a direction opposite to second direction D2. The first portions ML1a of the first metal lines ML1 may be disposed to be spaced apart from each other by a uniform distance in the second direction D2, and the second portions ML1b of the first metal lines ML1 may be in contact with the first connection contacts 172, respectively. Lengths of the second portions ML1b in the second direction D2 may increase with decreasing distance from the cell array region CAR. As an example, when viewed in a plan view, the first metal lines ML1 connected to the first connection lines CL1 may overlap the first stack ST1, and the first metal lines ML1 connected to the second connection lines CL2 may overlap the second stack ST2. In some embodiments, unlike that illustrated in the drawings, the first metal lines ML1 connected to the first connection lines CL1 may overlap the second stack ST2, and the first metal lines ML1 connected to the second connection lines CL2 may overlap the first stack ST1.

Similarly, each of the second metal lines ML2 may have an 'L'-shaped structure. For example, as shown in FIGS. 18 and 19, each of the second metal lines ML2 may include a third portion ML2a extending in the first direction D1, and a fourth portion ML2b, which extends from an end of the third portion ML2a in the second direction D2 or a direction opposite to second direction D2. The third portions ML2a of the second metal lines ML2 may be disposed to be spaced apart from each other by a uniform distance in the second direction D2, and the fourth portions ML2b of the second metal lines ML2 may be in contact with the second connection contacts 174, respectively. Lengths of the fourth portions ML2b in the second direction D2 may increase with decreasing distance from the cell array region CAR. As an example, when viewed in a plan view, the second metal lines ML2 connected to the first connection lines CL1 may overlap the first stack ST1, and the second metal lines ML2 connected to the second connection lines CL2 may overlap the second stack ST2. In some embodiments, unlike that illustrated in the drawings, the second metal lines ML2 connected to the first connection lines CL1 may overlap the second stack ST2, and the second metal lines ML2 connected to the second connection lines CL2 may overlap the first stack ST1.

In some embodiments, the first and second electrodes EL1 and EL2 connected to the first metal lines ML1 may have a vertical height that is lower than that of the first and second electrodes EL1 and EL2 connected to the second metal lines ML2. In other words, when measured in the first direction D1, the first and second electrodes EL1 and EL2 connected to the first metal lines ML1 may be longer the first and second electrodes EL1 and EL2 connected to the second metal lines ML2. But present inventive concepts are not limited thereto. The shapes and arrangements of the first and second metal lines ML1 and ML2 may not be limited thereto and may be variously changed. In some embodiments, the first and second electrodes EL1 and EL2 connected to the first metal lines ML1 may have a vertical height that is higher than that of the first and second electrodes EL1 and EL2 connected to the second metal lines ML2.

The first and second connection contacts 172 and 174 may be provided to be spaced apart from each other in the first direction D1. In some embodiments, the first and second connection contacts 172 and 174 may overlap the common source region CSR, when viewed in a plan view. The cell array region CAR may be closer to the second connection contacts 174 than to the first connection contacts 172, and a vertical length (in the third direction D3) of the second connection contacts 174 may be shorter than that of the first connection contacts 172. The first and second metal lines ML1 and ML2 and the first and second connection contacts 172 and 174 may be formed of or include, for example, tungsten or copper. In some embodiments, the first metal lines ML1 and the second metal lines ML2 may include different metallic materials. For example, the first metal lines ML1 may include tungsten, and the second metal lines ML2 may include copper. In this case, the bit lines BL1 and BL2 may include the same metal (i.e., copper) as the second metal lines ML2.

According to some embodiments of present inventive concepts, the first and second connection lines CL1 and CL2 may be separated from each other and may be connected to the first and second metal lines ML1 and ML2, respectively, which are provided at different levels. Accordingly, even if, owing to an increased integration density of a semiconductor device, the number of signal or interconnection lines to be connected to the electrodes of the electrode structure is increased, it may be possible to reduce limitation on an area allowed for the signal or interconnection lines. As a result, it may be possible to realize a highly-integrated three-dimensional semiconductor memory device.

Figure 20:
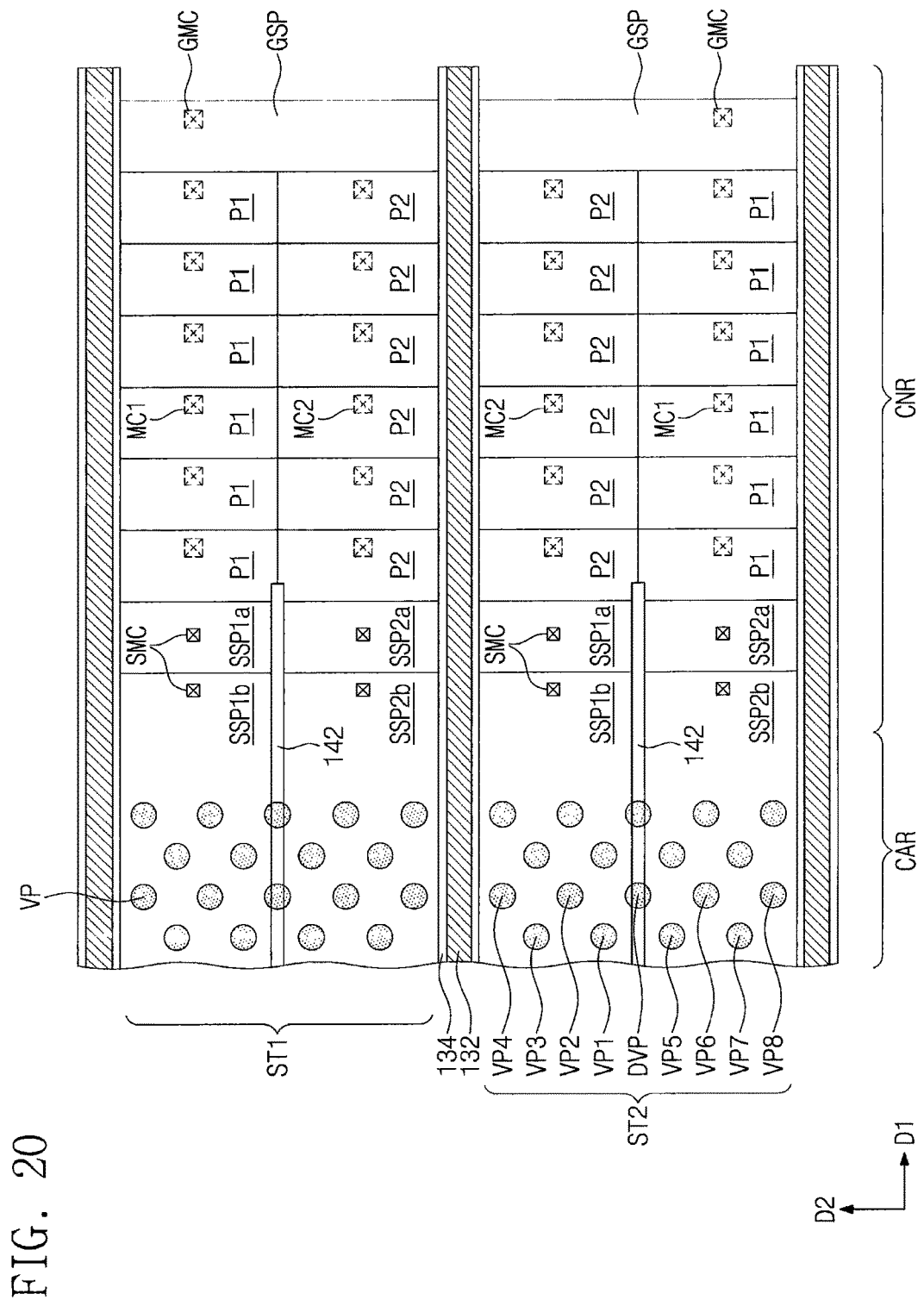
FIG. 20 is a plan view illustrating a stair-step structure of stacks according to some embodiments of present inventive concepts.
Figure 21:
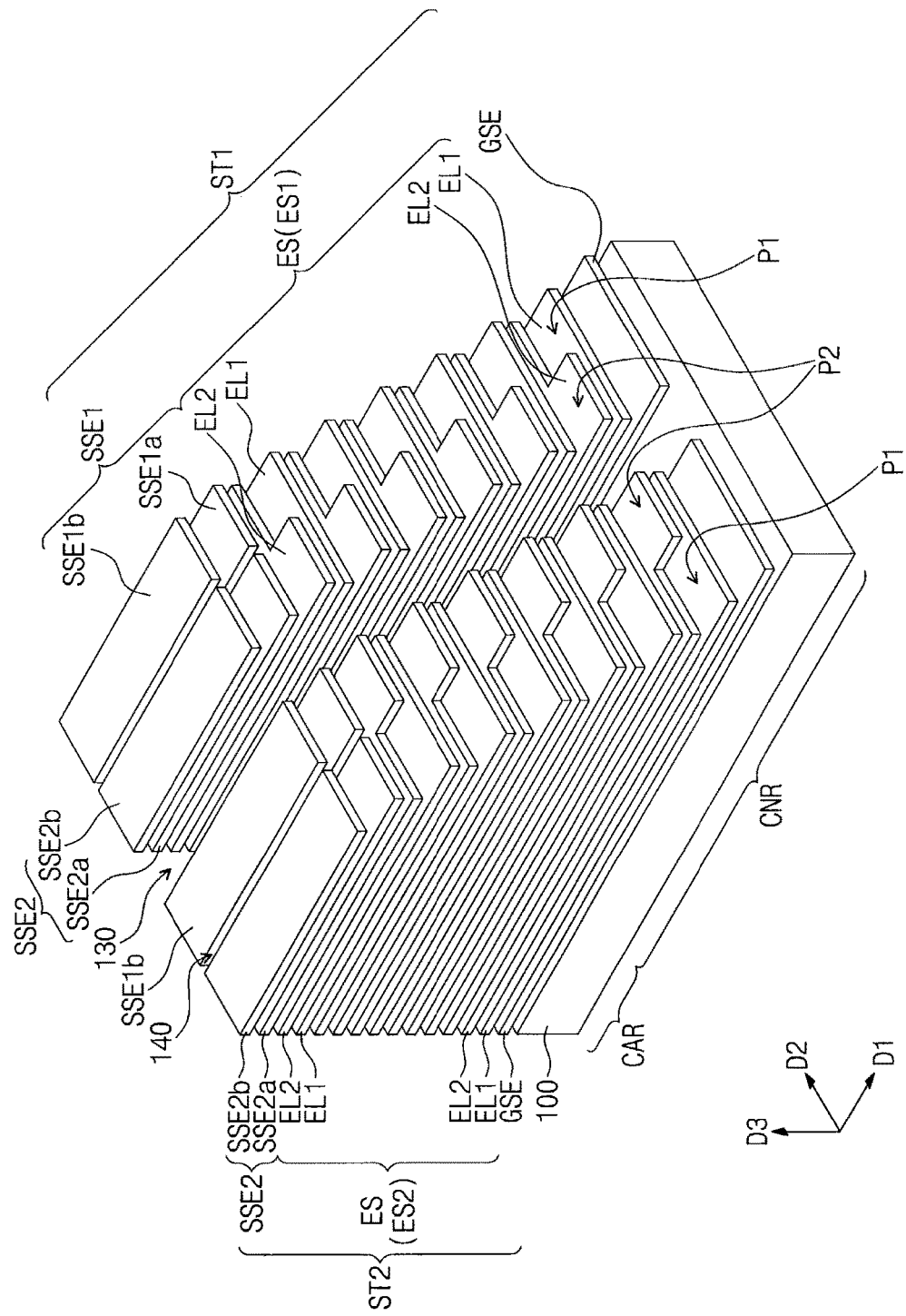
FIG. 21 is a perspective view illustrating a stair-step structure of stacks according to some embodiments of present inventive concepts.

FIG. 20 is a plan view illustrating a stair-step structure of stacks according to some embodiments of present inventive concepts. FIG. 21 is a perspective view illustrating a stair-step structure of stacks according to some embodiments of present inventive concepts. The stair-step structure of the stacks shown in FIGS. 20 and 21 may be substantially the same as that described with reference to FIGS. 6 and 7, except that the second stair-step structures of the electrode structures are disposed to be adjacent to each other. Thus, for the sake of brevity, the elements and features of this example that are similar to those previously shown and described may be omitted or not be described in much further detail.

Referring to FIGS. 20 and 21, each of the first and second electrode structures ES1 and ES2 may have the first stair-step structure, which is defined by the first pad regions P1 of the first electrodes EL1, and the second stair-step structure, which is defined by the second pad regions P2 of the second electrodes EL2. In some embodiments, the second stair-step structure of the first electrode structure ES1 may be provided on the substrate 100 to be adjacent to the second stair-step structure of the second electrode structure ES2 in the second direction D2. That is, the second pad regions P2 of the first electrode structure ES1 and the second pad regions P2 of the second electrode structure ES2 may be adjacent to each other in the second direction D2. In other words, the first and second electrode structures ES1 and ES2, which are disposed on the connection region CNR to be adjacent to each other in the second direction D2, may be disposed to have mirror symmetry about an imaginary plane parallel to the first direction D1.

Furthermore, the first contacts MC1 may be respectively coupled to the first pad regions P1 of the first electrodes EL1. The second contacts MC2 may be provided on the connection region CNR to penetrate the first interlayer insulating layer 150 and to be connected to the second pad regions P2 of the second electrodes EL2, respectively. In other words, the first contacts MC1 may be provided on the first stair-step structures of the first and second electrode structures ES1 and ES2, and the second contacts MC2 may be disposed on the second stair-step structures of the first and second electrode structures ES1 and ES2. Accordingly, the first contacts MC1 may be arranged to be spaced apart from each other in the first direction D1, and bottom surfaces of the first contacts MC1 may be positioned at different levels from the substrate 100. Similarly, the second contacts MC2 may be arranged to be spaced apart from each other in the first direction D1, and bottom surfaces of the second contacts MC2 may be positioned at different levels from the substrate 100. The first contacts MC1 coupled to the first electrode structure ES1 may be adjacent to ones of the first contacts MC1 that are coupled to the second electrode structure ES2, in the second direction D2. Other configurations may be substantially the same as those described with reference to FIGS. 6 and 7.

The first connection lines CL1 described with reference to FIGS. 13 to 15 may be connected in common to the first contacts MC1, which are disposed to be adjacent to each other in the second direction D2, and the second connection lines CL2 may be connected in common to the second contacts MC2, which are disposed to be adjacent to each other in the second direction D2. The first metal lines ML1 described with reference to FIGS. 16 to 19 may be connected to some of the first and second connection lines CL1 and CL2, and the second metal lines ML2 may be connected to others of the first and second connection lines CL1 and CL2.

Figure 22:
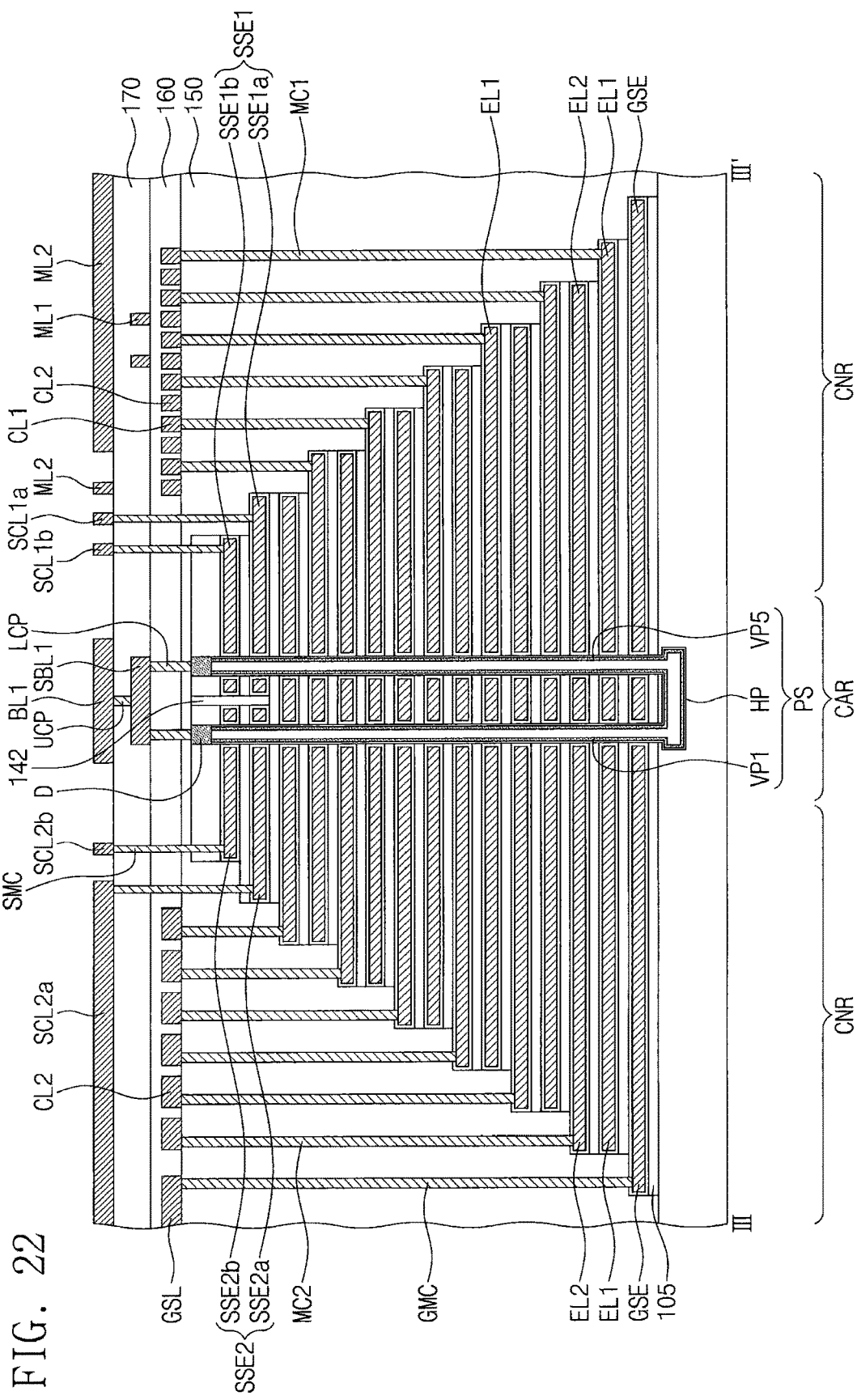
FIG. 22 is a cross-sectional view, which is taken along line III-III' of FIG. 5 to illustrate a semiconductor device according to some embodiments of present inventive concepts.

FIG. 22 is a cross-sectional view, which is taken along line III-III' of FIG. 5 to illustrate a semiconductor device according to some embodiments of present inventive concepts. For concise description, an element previously described with reference to FIGS. 4 to 9, 10A, 10B, and 11 to 19 may be identified by a similar or identical reference number without repeating an overlapping description thereof.

As shown in FIG. 22, pillar structures PS may be provided to penetrate the first and second stacks ST1 and ST2. Each of the pillar structures PS may include the vertical pillars VP (e.g., the first and fifth vertical pillars VP1 and VP5), which are provided to penetrate the stacks ST1 and ST2, and a horizontal connecting portion HP, which is provided below the stacks ST1 and ST2 to connect the vertical pillars VP1 and VP5 to each other. The vertical pillars VP1 and VP5 may be provided in vertical holes penetrating the stacks ST1 and ST2. The horizontal connecting portion HP may be provided in a recess region, which is formed in an upper portion of the substrate 100. The horizontal connecting portion HP may be provided between the substrate 100 and the stacks ST1 and ST2 to connect the vertical pillars VP1 and VP5 to each other.

In some embodiments, the horizontal connecting portion HP may be a hollow pipe or macaroni shaped structure continuously connected to the vertical pillars VP1 and VP5. For example, the vertical pillars VP1 and VP5 and the horizontal connecting portion HP may be a pipe-shaped structure that is provided in the form of a single body. In other words, the vertical pillars VP1 and VP5 and the horizontal connecting portion HP may be a single continuous semiconductor layer that is substantially absent/free of any internal interface/division. Here, the semiconductor layer may have one of polycrystalline, amorphous, and single-crystalline structures.

FIGS. 23 to 27 are diagrams illustrating a method of forming a stack of a semiconductor device, according to some embodiments of present inventive concepts.

Figure 23:
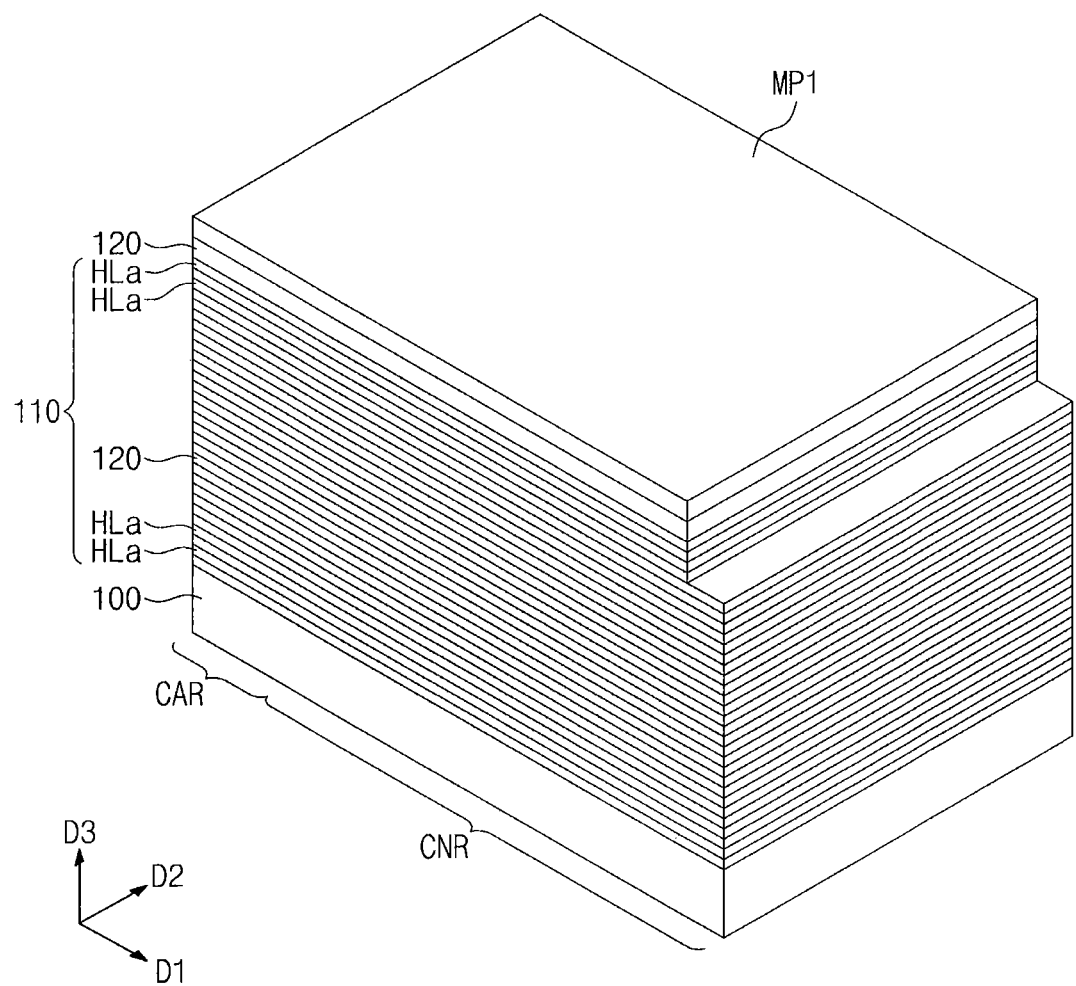
FIGS. 23 to 27 are diagrams illustrating a method of forming a stack of a semiconductor device, according to some embodiments of present inventive concepts.

Referring to FIG. 23, a layered structure 110 may be formed on the substrate 100 including the cell array region CAR and the connection region CNR. The layered structure 110 may include horizontal layers HLa and the insulating layers 120, which are alternatingly stacked on the substrate 100. In some embodiments, the electrodes GSE, EL1, EL2, SSE1, and SSE2 described above may be formed using the patterning method to be described below. In other words, the horizontal layers HLa may be used as the electrodes GSE, EL1, EL2, SSE1, and SSE2 described above.

The horizontal layers HLa may be formed of a material having an etch selectivity with respect to the insulating layers 120. For example, the insulating layers 120 may be a silicon oxide layer, and the horizontal layers HLa may include at least one of a silicon nitride layer, silicon oxynitride layer, a poly silicon layer, or metal layers. In some embodiments, the horizontal layers HLa may be formed of the same material.

A first mask pattern MP1 may be formed on the layered structure 110. The first mask pattern MP1 may expose a portion of the layered structure 110, on the connection region CNR.

Thereafter, a trimming process on the first mask pattern MP1 and an etching process on the layered structure 110 may be repeatedly performed. The etching process may be performed to etch a plurality of the horizontal layers HLa, which are exposed by the first mask pattern MP1, using the first mask pattern MP1 as an etch mask. For example, except for a step for etching the lowermost one of the horizontal layers HLa, an etching depth in an etching process may be equal to or greater than twice a vertical pitch of the horizontal layers HLa. Here, the vertical pitch of the horizontal layers HLa may mean a vertical distance (in the third direction D3) between top surfaces of the horizontal layers HLa, which are vertically adjacent to each other. Also, the trimming process may be performed to reduce a size of the first mask pattern MP1, and thus, a sidewall of the first mask pattern MP1 may be horizontally recessed toward the cell array region CAR by a specific distance. Here, the horizontal recess depth of the sidewall of the first mask pattern MP1 may correspond to widths, in the first direction D1, of the first and second pad regions P1 and P2 of the first and second electrodes EL1 and EL2.

Figure 24:
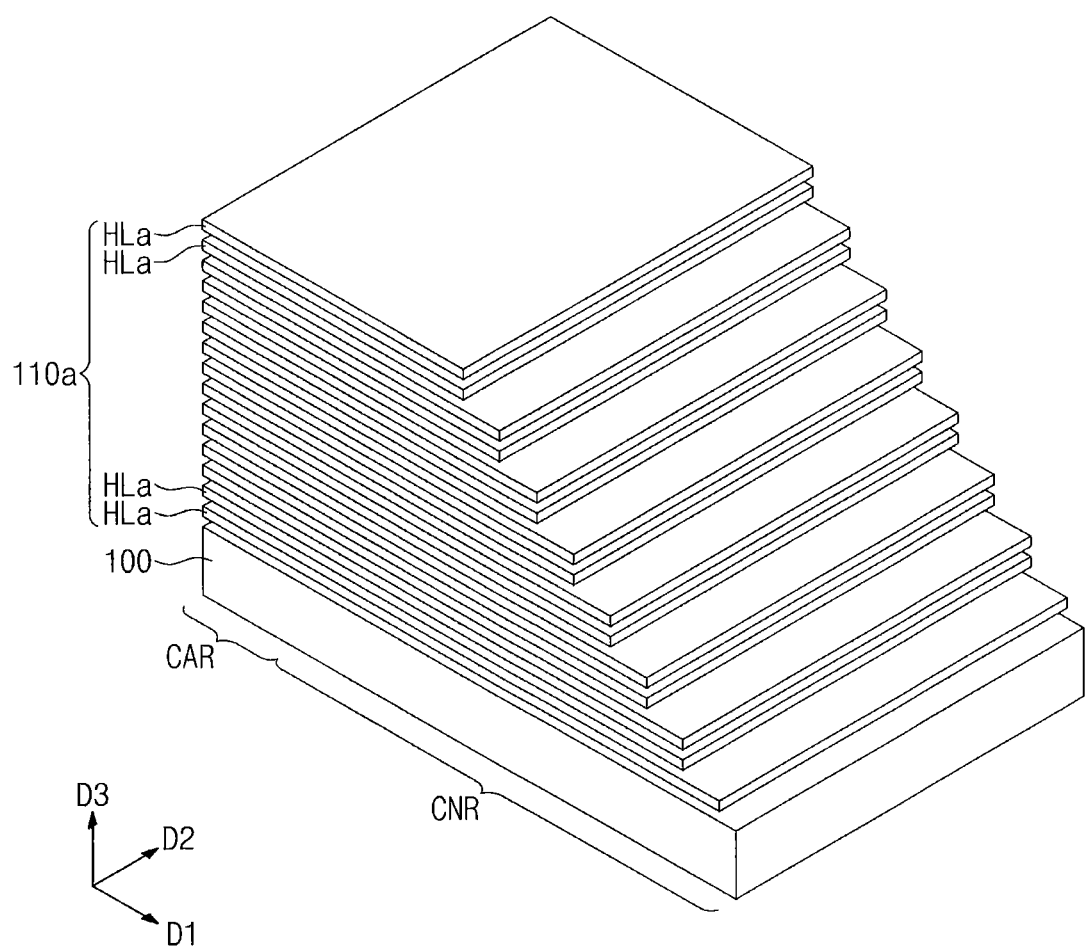

In some embodiments, the trimming process on the first mask pattern MP1 and the etching process on the layered structure 110 may be alternatingly repeated, and thus, as shown in FIG. 24, end portions of odd-numbered ones of the horizontal layers HLa may be exposed to form a first preliminary stack 110a. The first preliminary stack 110a may have a stair-step structure, which is formed by the exposed end portions of the odd-numbered ones of the horizontal layers HLa on the connection region CNR.

Figure 25:
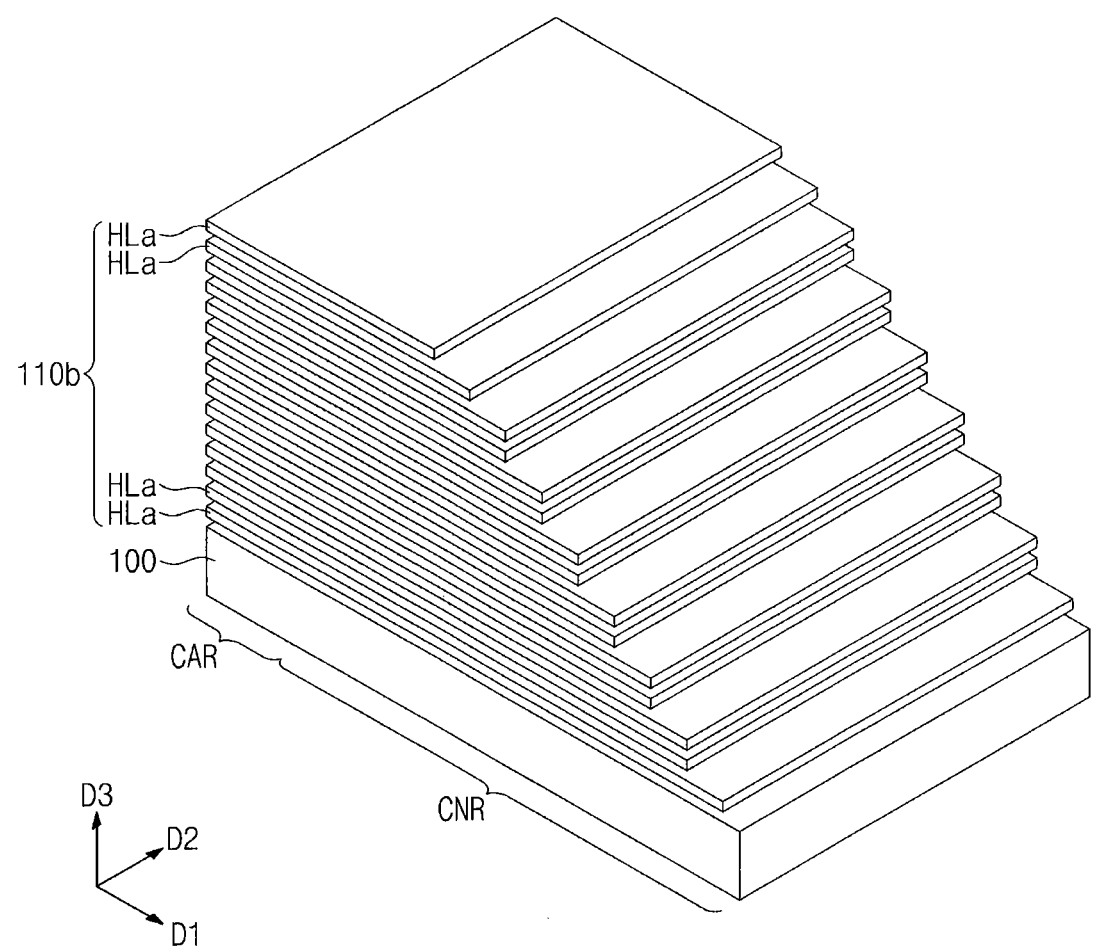

Referring to FIG. 25, the uppermost one of the horizontal layers HLa may be partially patterned to form a second preliminary stack 110b. In the second preliminary stack 110b, the uppermost one of the horizontal layers HLa may be formed to expose an end portion of the horizontal layer HLa positioned therebelow. In the second preliminary stack 110b, each of the lowermost one of the horizontal layers HLa, the uppermost one of the horizontal layers HLa, and the second uppermost one of the horizontal layer HLa may form a single stair layer, and each vertically-adjacent pair of the others of the horizontal layers HLa may form stair layers.

Figure 26:
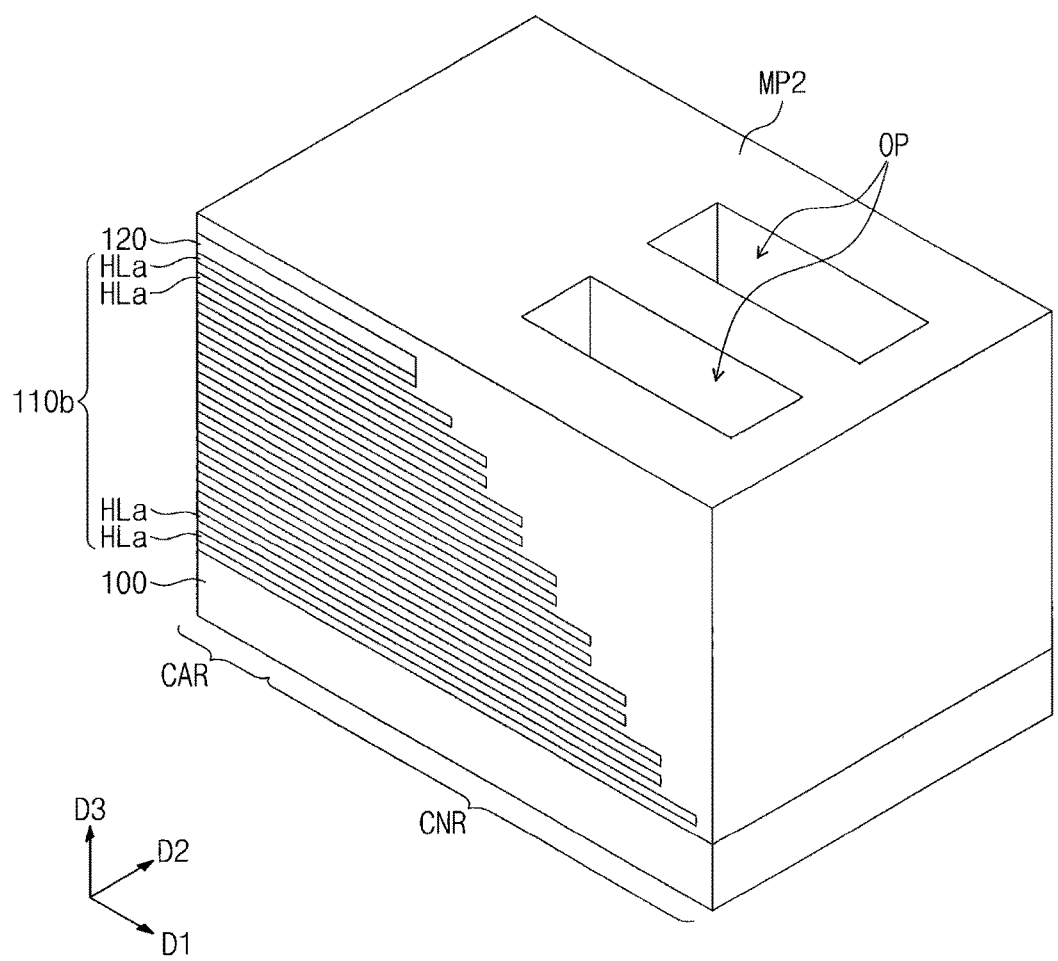

Referring to FIG. 26, a second mask pattern MP2 may be formed on the second preliminary stack 110b. The second mask pattern MP2 may have openings OP, each of which is formed to expose a portion of the stair-step structure of the second preliminary stack 110b. The openings OP of the second mask pattern MP2 may be formed to expose an end portion of odd-numbered ones of the horizontal layers HLa except for the lowermost and uppermost ones of the horizontal layers HLa. The openings OP may have a rectangular shape whose a longitudinal axis is parallel to the first direction D1 and may be spaced apart from each other in the second direction D2.

Figure 27:
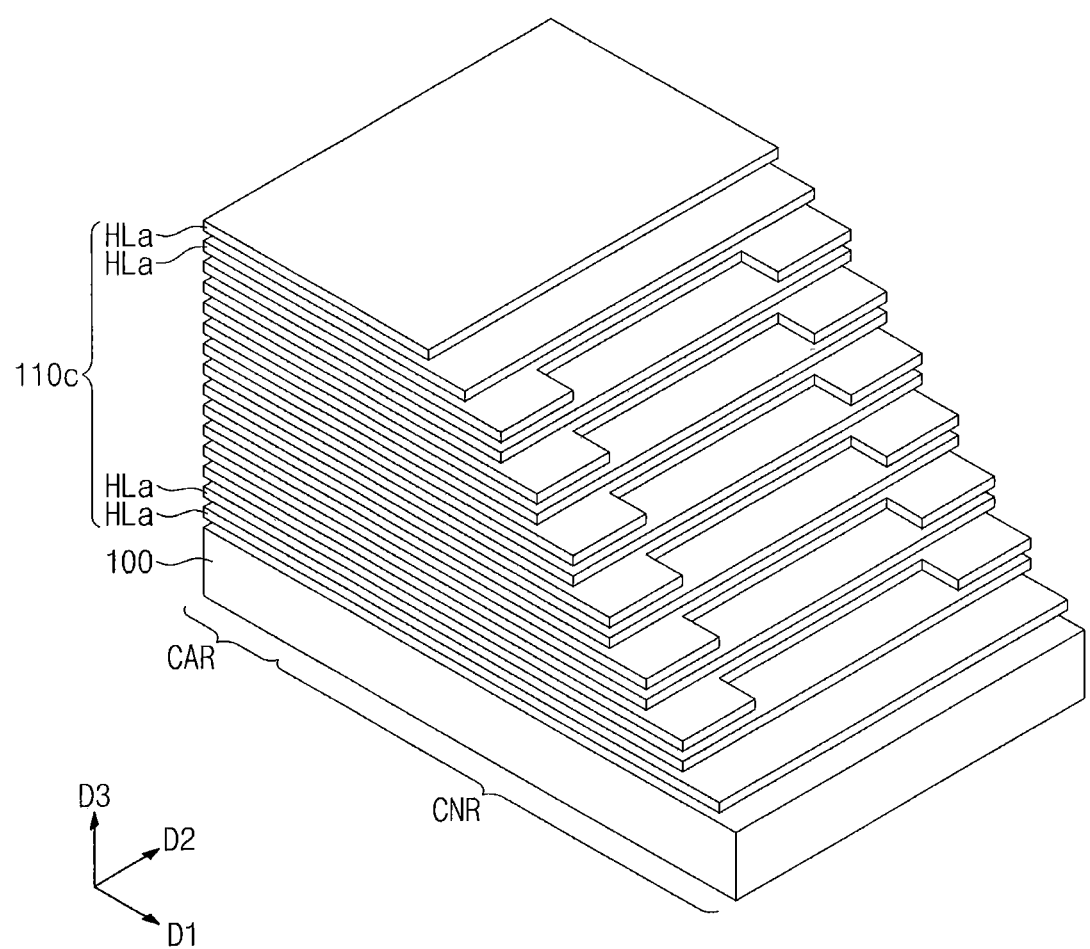

The third preliminary stack 110c of FIG. 27 may be formed by etching a portion of the stair-step structure of the second preliminary stack 110b using the second mask pattern MP2 as an etch mask. An etching depth in the etching process may be smaller than that in the etching process using the first mask pattern MP1 of FIG. 23 as an etch mask. For example, the etching depth may be substantially equal to the vertical pitch of the horizontal layers HLa. Accordingly, the odd-numbered ones of the horizontal layers HLa exposed by the second mask pattern MP2 may be partially etched to expose the end portions of the even-numbered ones of the horizontal layers HLa of the second preliminary stack 110b and thereby to form the third preliminary stack 110c.

The second mask pattern MP2 may be removed after the formation of the third preliminary stack 110c, and then, fourth mask patterns, which extend in the first direction D1 and have a line-shaped structure, may be formed on the third preliminary stack 110c. Thereafter, the third preliminary stack 110c may be etched using the fourth mask patterns to form the stacks (e.g., ST1 and ST2 of FIG. 7) which are spaced apart from each other in the second direction D2.

According to some embodiments of present inventive concepts, electrodes, which are respectively included in first and second electrode structures adjacent to each other and are positioned at the same level, may be connected to first or second connection lines through corresponding contacts. When viewed in a plan view, the first and second connection lines may be alternatingly and repeatedly disposed and may have shapes different from each other, and this may make it possible to simplify a process of forming the contacts and the connection lines.

In addition, the first and second connection lines may be respectively connected to first and second metal lines positioned at different levels. Accordingly, even if, due to an increased integration density of a semiconductor device, the number of signal or interconnection lines to be connected to the electrodes of the electrode structure is increased, it may be possible to reduce a limitation on an area designated/provided/allowed for the signal or interconnection lines. As a result, it may be possible to realize a highly-integrated three-dimensional semiconductor memory device.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
a substrate comprising a cell array region and a connection region;

first and second electrode structures that extend in a first direction on the substrate and are spaced apart from each other in a second direction that intersects the first direction, each of the first and second electrode structures comprising first and second electrodes vertically and alternatingly stacked on the substrate and comprising a stair-step structure on the connection region;

respective string selection electrodes on the first and second electrode structures, each of the string selection electrodes comprising first and second string selection electrodes that are spaced apart from each other in the second direction by an insulating separation layer;

first connection lines that connect coplanar ones of the first electrodes of the first and second electrode structures; and second connection lines that connect coplanar ones of the second electrodes of the first and second electrode structures, wherein each of the first connection lines comprises a line-shaped structure extending in the second direction, wherein each of the second connection lines comprises a shape different from the line-shaped structure when viewed in a plan view, wherein each of the first connection lines has a first length in the second direction, and wherein each of the second connection lines has a second length in the second direction, and the second length is greater than the first length.

2. The semiconductor device of claim 1, wherein the first and second connection lines are coplanar and are alternatingly and repeatedly disposed in the first direction.

3. The semiconductor device of claim 1, wherein:
each of the first electrodes comprises a first pad region exposed by the second electrode thereon;
each of the second electrodes comprises a second pad region exposed by the first electrode or the string selection electrode thereon;
when viewed in the plan view, the first pad regions are arranged in the first direction; and
when viewed in the plan view, the second pad regions are arranged in the first direction and are adjacent the first pad regions in the second direction.

4. The semiconductor device of claim 3, wherein:
each of the second electrodes comprises an electrode portion comprising a first width and a protruding portion protruding from the electrode portion in the first direction and comprising a second width narrower than the first width;
on the connection region, each of the first electrodes comprises an end portion that is exposed by the protruding portion of the second electrode thereon;
the first pad regions are at the end portions of the first electrodes that are exposed by the protruding portions of the second electrodes; and
the second pad regions are at the protruding portions of the second electrodes.

5. The semiconductor device of claim 3, wherein the first pad regions of the first electrode structure are adjacent the first pad regions of the second electrode structure.

6. The semiconductor device of claim 5, further comprising:
first contacts connected to the first pad regions, respectively; and
second contacts connected to the second pad regions, respectively, wherein each of the first connection lines connects some of the first contacts that are adjacent each other in the second direction, and wherein each of the second connection lines connects some of the second contacts that are adjacent each other in the second direction.

7. The semiconductor device of claim 6,
wherein each of the second connection lines comprises:
a first connecting portion extending in the second direction; and
second connecting portions protruding from opposite ends of the first connecting portion in the first direction away from the cell array region, and wherein the second contacts are connected to the second connecting portions.

8. The semiconductor device of claim 6,
wherein each of the second connection lines comprises:
a first connecting portion extending in the second direction; and
second connecting portions protruding from opposite ends of the first connecting portion toward the cell array region, and wherein the second contacts are connected to the second connecting portions.

9. The semiconductor device of claim 3, wherein the second pad regions of the first electrode structure are adjacent the second pad regions of the second electrode structure.

10. The semiconductor device of claim 1, further comprising:
first metal lines connected to some of the first connection lines and some of the second connection lines, respectively; and
second metal lines connected to others of the first connection lines and others of the second connection lines, respectively, wherein the first metal lines are at a higher level than the first and second connection lines, and wherein the second metal lines are at a higher level than the first metal lines.

11. The semiconductor device of claim 1, further comprising:
first vertical pillars on the cell array region to penetrate the first and second electrode structures and the first string selection electrodes on the first and second electrode structures;
second vertical pillars on the cell array region to penetrate the first and second electrode structures and the second string selection electrodes on the first and second electrode structures; and
dummy vertical pillars on the cell array region and between the first and second string selection electrodes, the dummy vertical pillars penetrating the first and second electrode structures.

12. The semiconductor device of claim 11,
wherein the first vertical pillars comprise first to fourth subsidiary vertical pillars in a zigzag arrangement in the second direction, and wherein the second vertical pillars comprise fifth to eighth subsidiary vertical pillars in a zigzag arrangement in the second direction.

13. A semiconductor device, comprising:
a substrate comprising a cell array region and a connection region;
first and second electrode structures that extend in a first direction on the substrate and are spaced apart from each other in a second direction that intersects the first direction, each of the first and second electrode structures comprising first and second electrodes vertically and alternatingly stacked on the substrate and comprising a stair-step structure on the connection region, wherein each of the first electrodes comprises a first pad region at an end portion thereof and each of the second electrodes comprises a second pad region at an end portion thereof, and wherein, when viewed in a plan view, the first pad regions are arranged in the first direction and each of the second pad regions is adjacent a corresponding one of the first pad regions in the second direction;

first contacts connected to the first pad regions, respectively;

second contacts connected to the second pad regions, respectively;

first connection lines, each of which connects ones of the first contacts that are adjacent each other in the second direction;

second connection lines, each of which connects ones of the second contacts that are adjacent each other in the second direction;

first metal lines, each of which is connected to ones of the first connection lines in a first group and ones of the second connection lines in the first group, wherein the first metal lines are at a higher level than the first connection lines and the second connection lines; and second metal lines at a higher level than the first metal lines, wherein each of the second metal lines is connected to ones of the first connection lines in a second group and ones of the second connection lines in the second group.

14. The semiconductor device of claim 13, wherein:
each of the second electrodes comprises an electrode portion comprising a first width and a protruding portion protruding from the electrode portion in the first direction and comprising a second width narrower than the first width;
the second pad regions are on the protruding portions;
each of the end portions of the first electrodes is exposed by the protruding portion thereon;
the first pad regions are on the end portions of the first electrodes that are exposed by the protruding portions of the second pad regions; and
each of the second pad regions of the second electrodes, except for uppermost ones of the second electrodes, is exposed by the first electrode thereon.

15. The semiconductor device of claim 13, further comprising a third contact that connects one of the second metal lines to one of the first connection lines or to one of the second connection lines.

16. A semiconductor device comprising:
first and second stacks of electrodes;
a plurality of first connection lines, comprising a first length, that connect inner portions of the first stack of electrodes to inner portions of the second stack of electrodes;
a plurality of second connection lines, comprising a second length longer than the first length, that connect outer portions of the first stack of electrodes to outer portions of the second stack of electrodes; and
first metal lines and second metal lines that overlap the plurality of first connection lines and the plurality of second connection lines, wherein uppermost surfaces of the second metal lines are non-coplanar with uppermost surfaces of the first metal lines.

17. The semiconductor device of claim 16, further comprising:
first contacts that connect the plurality of first connection lines to the inner portions of the first and second stacks;
second contacts that connect the plurality of second connection lines to the outer portions of the first and second stacks; and
a third contact that connects one of the second metal lines to one of the plurality of first connection lines or to one of the plurality of second connection lines,
wherein each of the first and second stacks comprises a plurality of first electrodes and a plurality of second electrodes,
wherein the inner portions comprise upper surfaces of the plurality of first electrodes, and
wherein the outer portions comprise upper surfaces of the plurality of second electrodes that are non-coplanar with the upper surfaces of the plurality of first electrodes.

18. The semiconductor device of claim 17, wherein uppermost surfaces of the plurality of first connection lines are coplanar with uppermost surfaces of the plurality of second connection lines.

19. The semiconductor device of claim 16, wherein each of the first and second stacks comprises first and second stair-step-shaped structures, the semiconductor device further comprising:
first contacts that connect the plurality of first connection lines to the inner portions at a first plurality of levels of the first and second stair-step-shaped structures; and
second contacts that connect the plurality of second connection lines to the outer portions at a second plurality of levels of the first and second stair-step-shaped structures that are non-coplanar with the first plurality of levels, wherein pairs of the first contacts are laterally aligned with respective pairs of the second contacts.

20. The semiconductor device of claim 19, wherein:
the first metal lines are connected to a first group of the plurality of first connection lines and the plurality of second connection lines;
the second metal lines are connected to a second group of the plurality of first connection lines and the plurality of second connection lines; and
the first and second metal lines overlap the first and second groups, respectively.

21. The semiconductor device of claim 16, further comprising:
a first pair of contacts that connects a first one of the plurality of first connection lines to the first and second stacks;
a second pair of contacts that connects a second one of the plurality of first connection lines to the first and second stacks; and
a third pair of contacts that connects one of the plurality of second connection lines to the first and second stacks,
wherein the one of the plurality of second connection lines comprises a nearest one of the plurality of second connection lines to the first pair of contacts, and
wherein the first pair of contacts is closer to the second pair of contacts than to the third pair of contacts.

* * * * *